United States Patent
Lou

(10) Patent No.: US 11,322,070 B2
(45) Date of Patent: May 3, 2022

(54) DISPLAY PANEL, TRANSPARENT OLED SUBSTRATE AND OLED SUBSTRATE

(71) Applicant: Yungu (Gu'an) Technology Co., Ltd., Langfang (CN)

(72) Inventor: Junhui Lou, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 0 days.

(21) Appl. No.: 17/011,233

(22) Filed: Sep. 3, 2020

(65) Prior Publication Data
US 2020/0402443 A1 Dec. 24, 2020

Related U.S. Application Data

(63) Continuation of application No. PCT/CN2019/093730, filed on Jun. 28, 2019.

(30) Foreign Application Priority Data

Dec. 28, 2018 (CN) .......................... 201811627472.4

(51) Int. Cl.
*G09G 3/20* (2006.01)
*G09G 3/3216* (2016.01)
(Continued)

(52) U.S. Cl.
CPC ......... *G09G 3/2003* (2013.01); *G09G 3/3216* (2013.01); *G09G 3/3225* (2013.01);
(Continued)

(58) Field of Classification Search
CPC ......... G09G 2300/0876; G09G 3/3208; G09G 3/3216; G09G 3/3225; G09G 3/3258
See application file for complete search history.

(56) References Cited

U.S. PATENT DOCUMENTS 9,164,641 B1 * 10/2015 Rowe ................... G06F 3/04184
9,361,851 B1 * 6/2016 Basehore .............. G06F 1/1616
(Continued)

FOREIGN PATENT DOCUMENTS

CN  101924125 A  12/2010
CN  105355646 A  2/2016
(Continued)

OTHER PUBLICATIONS

International Search Report dated Oct. 9, 2019 in corresponding International application No. PCT/CN2019/093730; 4 pages.
(Continued)

*Primary Examiner* — Kevin M Nguyen
(74) *Attorney, Agent, or Firm* — Maier & Maier, PLLC

(57) ABSTRACT

The present disclosure provides a display panel, a transparent OLED substrate and an OLED substrate. The transparent OLED substrate includes: a base substrate; a first electrode layer located on the base substrate; a light emitting structure layer located on the first electrode layer and including light emitting structures of n colors, $n \geq 1$; and a second electrode located on the light emitting structure layer. The first electrode layer includes electrode groups arranged along a first direction, each electrode group includes first electrode(s), each first electrode extends along a second direction perpendicular to the first direction. When a driving voltage is between each first electrode and the second electrode, the transparent OLED substrate performs a display function; and otherwise, the transparent OLED substrate performs a light transmission function.

15 Claims, 18 Drawing Sheets

(51) Int. Cl.
  *G09G 3/3225* (2016.01)
  *H01L 27/32* (2006.01)
  *H01L 51/52* (2006.01)

(52) U.S. Cl.
  CPC ............... *G09G 2300/0426* (2013.01); *G09G 2300/0452* (2013.01); *H01L 27/3246* (2013.01); *H01L 27/3283* (2013.01); *H01L 51/5218* (2013.01); *H01L 51/5234* (2013.01)

(56) References Cited

U.S. PATENT DOCUMENTS

| | | | |
|---|---|---|---|
| 2006/0139254 A1* | 6/2006 | Hayakawa | G09G 3/3291 345/76 |
| 2007/0029940 A1 | 2/2007 | Tsuge | |
| 2010/0045024 A1* | 2/2010 | Attner | B42D 25/351 427/7 |
| 2013/0162512 A1* | 6/2013 | Andersson Ersman | G09G 3/344 345/107 |
| 2017/0338293 A1 | 11/2017 | Guo | |
| 2018/0151630 A1* | 5/2018 | Yamaoka | G09G 3/3258 |
| 2018/0357952 A1 | 12/2018 | Yang | |
| 2019/0393286 A1 | 12/2019 | Ding et al. | |
| 2020/0211480 A1 | 7/2020 | Xiang et al. | |

FOREIGN PATENT DOCUMENTS

| | | |
|---|---|---|
| CN | 106203026 A | 12/2016 |
| CN | 108336117 A | 7/2018 |
| CN | 108364957 A | 8/2018 |
| CN | 108364967 A | 8/2018 |
| CN | 108365122 A | 8/2018 |
| CN | 108365123 A | 8/2018 |
| CN | 108376696 A | 8/2018 |
| CN | 108389879 A | 8/2018 |
| CN | 108717244 A | 10/2018 |
| EP | 1 903 610 A2 | 3/2008 |
| EP | 2 749 939 A2 | 7/2014 |
| JP | 2009529701 A | 8/2009 |
| JP | 2011129392 A | 6/2011 |
| KR | 10-2017-0024182 A | 3/2017 |
| TW | 200905346 A | 2/2009 |
| TW | 201507134 A | 2/2015 |
| TW | 201820605 A | 6/2018 |

OTHER PUBLICATIONS

Written Opinion of the International Searching Authority dated Oct. 9, 2019 in corresponding International application No. PCT/CN2019/093730; 7 pages.
First Chinese Office Action and Search Report dated Apr. 29, 2020 in corresponding Chinese application No. 201811627472.4; 21 pages.
Second Chinese Office Action dated Jun. 22, 2020 in corresponding Chinese application No. 201811627472.4; 10 pages.
Taiwanese Office Action dated May 27, 2020 in corresponding Taiwanese application No. 108125139; 5 pages.
Japanese Office Action Issued in corresponding application No. 2020-571655, dated Jan. 4, 2022, 12 pages.
The Extended European European Search Report dated Aug. 9, 2021, including the Supplementary European Search Report and the European Search Opinion, in connection with EP Application No. 19902278.1 (10 pp.).

* cited by examiner

DISPLAY PANEL, TRANSPARENT OLED SUBSTRATE AND OLED SUBSTRATE

CROSS REFERENCE TO RELATED APPLICATIONS

This disclosure is a continuation of International Patent Application No. PCT/CN2019/093730, filed on Jun. 28, 2019, which claims priority to Chinese Patent Application No. 2018116274724, titled "DISPLAY PANEL, TRANSPARENT OLED SUBSTRATE AND OLED SUBSTRATE", filed on Dec. 28, 2018. Both applications are incorporated herein by reference in their entireties.

TECHNICAL FIELD

The present disclosure relates to the field of OLED display devices, in particular to a display panel, a transparent OLED substrate and an OLED substrate.

BACKGROUND

With rapid development of display devices, users have increasingly higher requirements on screen-to-body ratio. Generally, because components such as a camera, a sensor, an earpiece and the like need being installed on the screen, a part of the screen, such as a front notch region of iPhone X, is reserved for installing these components, which affects the overall consistency of the screen. The full-screen display has received increasingly high attention from the industry.

SUMMARY

The objective of the present disclosure is to provide a display panel, a transparent OLED substrate and an OLED substrate, which may change the structure of the transparent OLED substrate, solve the diffraction problem, and improve the imaging quality of the transparent OLED substrate.

To achieve the objective, a first aspect of the present disclosure provides a transparent OLED substrate, including: a base substrate; a first electrode layer on the base substrate, where the first electrode layer includes a plurality of electrode groups arranged along a first direction, each of the electrode groups includes at least one first electrode, each first electrode extends along a second direction, and the second direction is perpendicular to the first direction; a light emitting structure layer on the first electrode layer, where the light emitting structure layer includes light emitting structures of n colors, n≥1; at least one of the light emitting structures is disposed on the first electrode, and a second electrode on the light emitting structure layer. When the at least one first electrode and the second electrode has a driving voltage therebetween, the transparent OLED substrate performs a display function; and when the at least one first electrode and the second electrode has no driving voltage therebetween, the transparent OLED substrate performs a light transmission function.

A second aspect of the present disclosure provides a display panel including the above transparent OLED substrate.

A third aspect of the present disclosure provides an OLED substrate. The OLED substrate includes a first OLED substrate; and a second OLED substrate. The first OLED substrate includes the above transparent OLED substrate. The second OLED substrate is an opaque substrate, and the first OLED substrate and the second OLED substrate share the base substrate.

The beneficial effects of the present disclosure are the follows.

In the full screen, the reason that the imaging effect of the under-screen camera becomes worse is as follows. The sub-pixels corresponding to the transparent display region contain a plurality of patterned layers. When light passes through the patterned layers, diffraction phenomenon occurs at the boundaries of the patterned layers. In view of this, the first electrode layer of the transparent OLED substrate includes a plurality of electrode groups arranged along the first direction. The electrode group includes at least one first electrode, and each first electrode in the same electrode group extends in a second direction perpendicular to the first direction. The size of the first electrode in the second direction is much larger than the size of the first electrode in the first direction. Compared to the structure that the first electrode has similar sizes both in the first direction and in the second direction, the structure of the present disclosure may reduce the number of the boundaries of the patterned layers, reduce the complexity, and mitigate the diffraction problems when light is transmitted. In this way, when the transparent OLED substrate performs a display function, a driving voltage is applied between the first electrodes and the second electrode, and the transparent OLED substrate is configured to perform the display function to display with an opaque OLED substrate and the entire OLED substrate forms a full screen. When the transparent OLED substrate performs the light transmitting function, no driving voltage is applied and driving is not performed between the first electrodes and the second electrode. Since the problem related to diffraction is solved, the imaging effect of the photosensitive element beneath the transparent OLED substrate may be improved.

DETAILED DESCRIPTION

In order to make the above objectives, features and advantages of the present disclosure more apparent and understandable, the following describes the embodiments of the present disclosure in detail with reference to the accompanying drawings.

Figure 1:
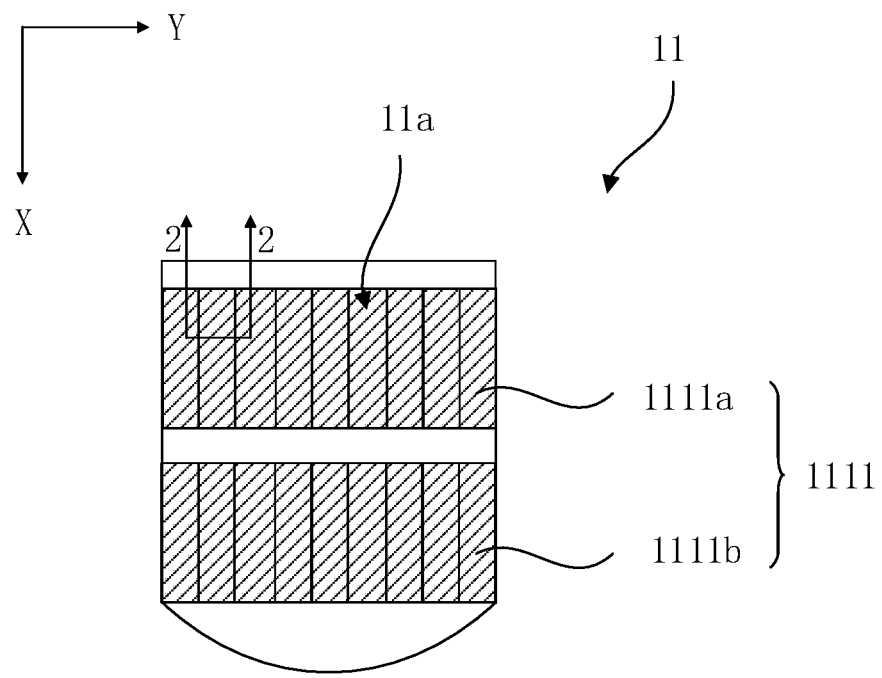
FIG. 1 is a top view of a transparent OLED substrate in a first embodiment of the present disclosure.
Figure 2:
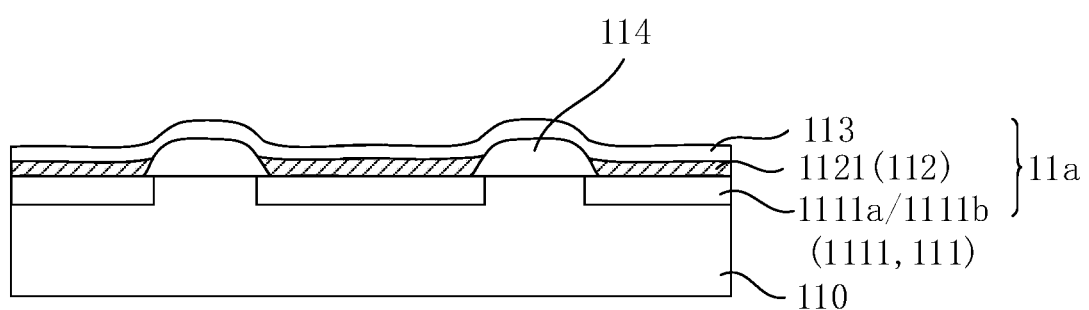
FIG. 2 is a cross-sectional view taken along line 2-2 in FIG. 1.

FIG. 1 is a top view of a transparent OLED (Organic Light emitting Diode) substrate in a first embodiment of the present disclosure; and FIG. 2 is a cross-sectional view taken along line 2-2 in FIG. 1.

Referring to FIGS. 1 and 2, a transparent OLED substrate 11 includes a base substrate 110, a first electrode layer 111 located on the base substrate 110, a light emitting structure layer 112 located on the first electrode layer 111, and a second electrode 113 located on the light emitting structure layer 112.

The first electrode layer 111 includes a plurality of electrode groups 1111 arranged along a first direction Y. Each electrode group 1111 includes two first electrodes 1111a, 1111b. The first electrodes 1111a, 1111b in the same electrode group 1111 both extend along a second direction X. That is, the size of the first electrode in the second direction X is much larger than the size thereof in the first direction Y, and the second direction X is perpendicular to the first direction Y. The second electrode 113 is a planar electrode.

The light emitting structure layer 112 includes light emitting structures 1121 of n colors, n≥1. One light emitting structure 1121 is disposed over one first electrode 1111a, and the light emitting structure 1121 for the same first electrode 1111a is of the same color. When a driving voltage is applied between the first electrodes 1111a, 1111b and the second electrode 113, the transparent OLED substrate 11 performs a display function; and when no driving voltage is applied between the first electrodes 1111a, 1111b and the second electrode 113, the transparent OLED substrate 11 performs a light transmission function.

In a specific implementation, the size of the first electrode 1111a in the second direction X is much larger than the size thereof in the first direction Y. Preferably, A ratio of the size in the second direction to the size in the first direction of the first electrode is more than 10:1. Alternatively, it may also be more than 20:1, 50:1, 100:1, or even more than 400:1.

Referring to FIG. 1, in the embodiment, the first direction Y is a row direction, and the second direction X is a column direction.

In addition, in the embodiment, the light emitting structure 1121 on one first electrode 1111a/1111b covers across the entire first electrode 1111a/1111b. That is, the light emitting structure 1121 extends from the top to the bottom of the first electrode 1111a/1111b. Alternatively, the light emitting structure 1121 may also be distributed only in a partial region of the entire first electrode 1111a/1111b. Referring to FIG. 2, the size and position of the light emitting structure 1121 on the first electrode 1111a/1111b are defined by a pixel definition layer 114. Alternatively, the pixel definition layer 114 may also be omitted, and the size and position of the light emitting structure 1121 may be defined by a pattern on a mask for evaporation.

The first electrodes 1111a/1111b and/or the light emitting structures 1121 are arranged in a plurality of columns extending from the top to the middle and from the middle to the bottom. Compared with the array with a plurality of rows and columns, the number of pattern boundaries may be reduced, which may mitigate the interference and diffraction problems when the transparent OLED substrate 11 transmits light.

One first electrode 1111a/1111b, the light emitting structure 1121 on the first electrode 1111a/1111b, and a portion of the second electrode 113 corresponding to the first electrode 1111a/1111b form one first OLED sub-pixel 11a.

In the embodiment, n=1, that is, all the first OLED sub-pixels 11a are sub-pixels of the same color. Alternatively, the first OLED sub-pixels 11a in two rows may all be red sub-pixels, green sub-pixels, blue sub-pixels, yellow sub-pixels or white sub-pixels. In other words, when the transparent OLED substrate 11 performs the display function, the transparent OLED substrate emits light in a single color.

The mode for the light emission of the first OLED sub-pixels 11a may be an active matrix type or a passive matrix type.

Passive Matrix OLED (PMOLED), also known as passively driven OLED, simply uses cathodes (second electrodes) and anodes (first electrodes) to form a matrix, and lights up a pixel at the intersection point of a row and a column in the array in a scanning manner Each sub-pixel is operated in a short pulse mode and emits light at high brightness for an instant. In other words, addressing of each OLED sub-pixel is directly controlled by an external circuit. The external circuit may be controlled by a display driver integrated chip (DDIC).

Active Matrix OLED (AMOLED), also known as actively driven OLED, includes a thin film transistor (TFT) array, and each thin film transistor in the thin film transistor array includes a storage capacitor. The AMOLED uses an independent thin film transistor to control a pixel to emit light, and each sub-pixel may emit light continuously. In other words, the addressing of each OLED sub-pixel is directly controlled by the thin film transistor array. A row select signal of the thin film transistor array may be from a GIP (Gate In Panel) circuit, and a column select signal may be from the display driver integrated chip (DDIC).

Figure 3:
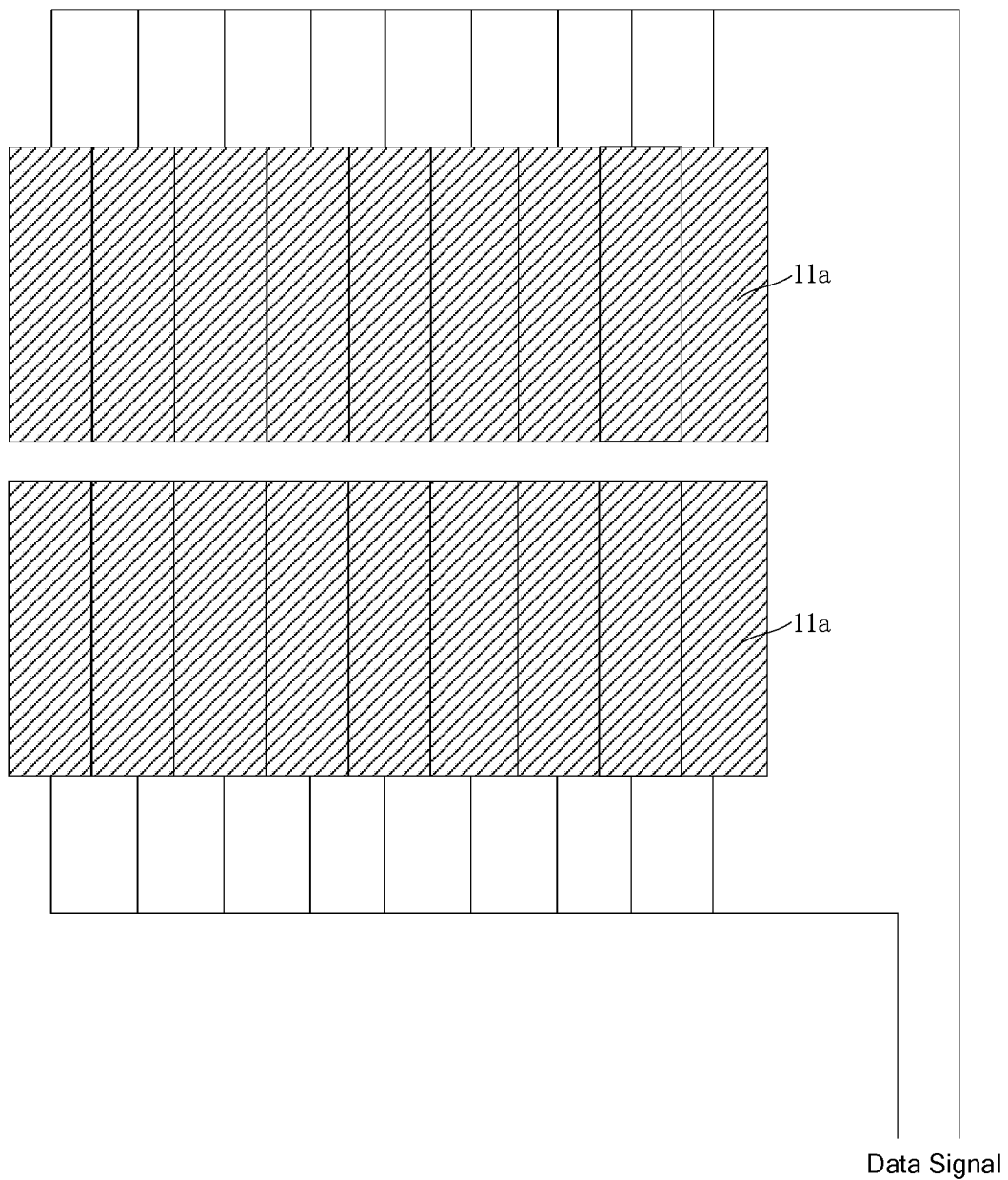
FIG. 3 is a schematic diagram of a circuit illustrating a passive matrix mode of first OLED sub-pixels of the same color in two rows of the transparent OLED substrate.

FIG. 3 is a schematic diagram of a circuit illustrating a passive matrix mode of first OLED sub-pixels of the same color in two rows of the transparent OLED substrate. Referring to FIG. 3, first OLED sub-pixels 11a in the first row have first electrodes coupled to one data signal, and first OLED sub-pixels 11a in the second row have first electrodes coupled to another one data signal; and all of the first OLED sub-pixels 11a have second electrodes coupled to the ground. The color data carried by the two data signal channels is consistent with the color of the corresponding first OLED sub-pixels 11a. The data signal is provided by the external circuit. Since the transparent OLED substrate has two rows of first OLED sub-pixels 11a, one driving current is to be applied to the first row and another driving current to the second row. The two driving currents may be from two data signal channels (data lines) of the display driver integrated chip (DDIC).

Figure 4:
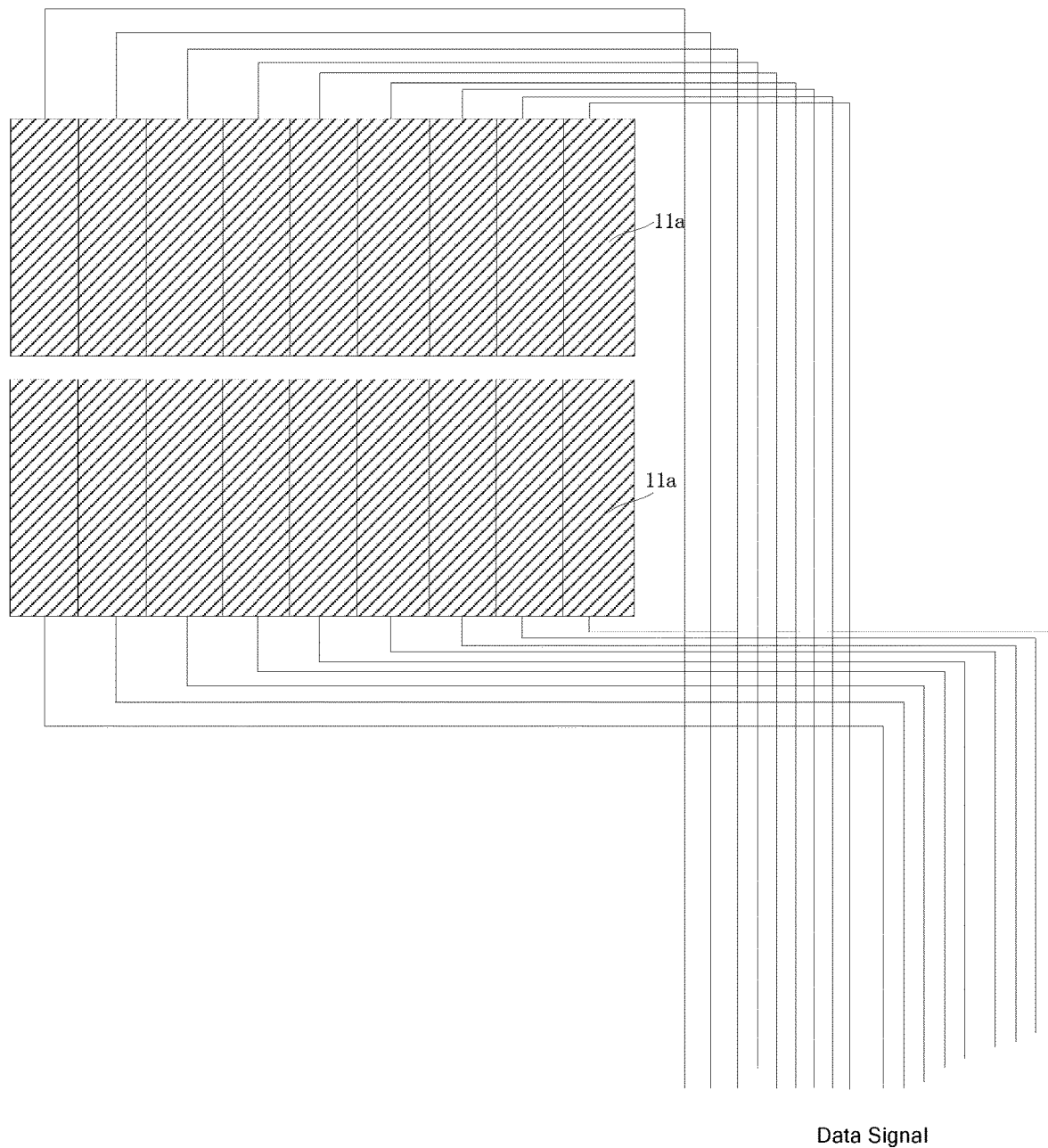
FIG. 4 is another schematic diagram of a circuit illustrating a passive matrix mode of first OLED sub-pixels of the same color in two rows of the transparent OLED substrate.

FIG. 4 is another schematic diagram of a circuit illustrating a passive matrix mode of first OLED sub-pixels of the same color in two rows of the transparent OLED substrate. Referring to FIG. 4, first electrodes of first OLED sub-pixels 11a in each row are coupled to respective data signals, and second electrodes of all the first OLED sub-pixels 11a are coupled to the ground. The color data carried by the data signal channels is consistent with the color of the corresponding first OLED sub-pixels 11a. The various data signals are also provided by the external circuit. Since the transparent OLED substrate has two rows of first OLED sub-pixels 11a, driving currents are to be applied to each first OLED sub-pixel 11a in the first and second rows. The driving currents may be from one data signal channel (data line) of the display driver integrated chip (DDIC), and all driving currents may be from a plurality of data signal channels (data lines) of the display driver integrated chip (DDIC).

In the embodiments of FIGS. 3 and 4, the traces of the first electrodes of the first OLED sub-pixels 11a in the first row are disposed in an upper bezel region and a lateral bezel region of the transparent OLED substrate 11. That is, the traces of the first electrodes are not disposed in the region where the first OLED sub-pixels 11a are located. Similarly, the traces of the first electrodes of the first OLED sub-pixels 11a in the second row are disposed in the lower bezel region and the lateral bezel region of the transparent OLED substrate 11. Compared to disposing the traces of the first electrodes in the region where the first OLED sub-pixels 11a are located, disposing the traces of the first electrodes in the bezel region may further reduce graphic film layers of the region where the first OLED sub-pixels 11a are located, and may further mitigate the interference and diffraction problems in light transmission mode.

Comparing FIG. 3 with FIG. 4: the former has fewer data signal channels, fewer connection traces, and smaller occupied area.

Figure 5:
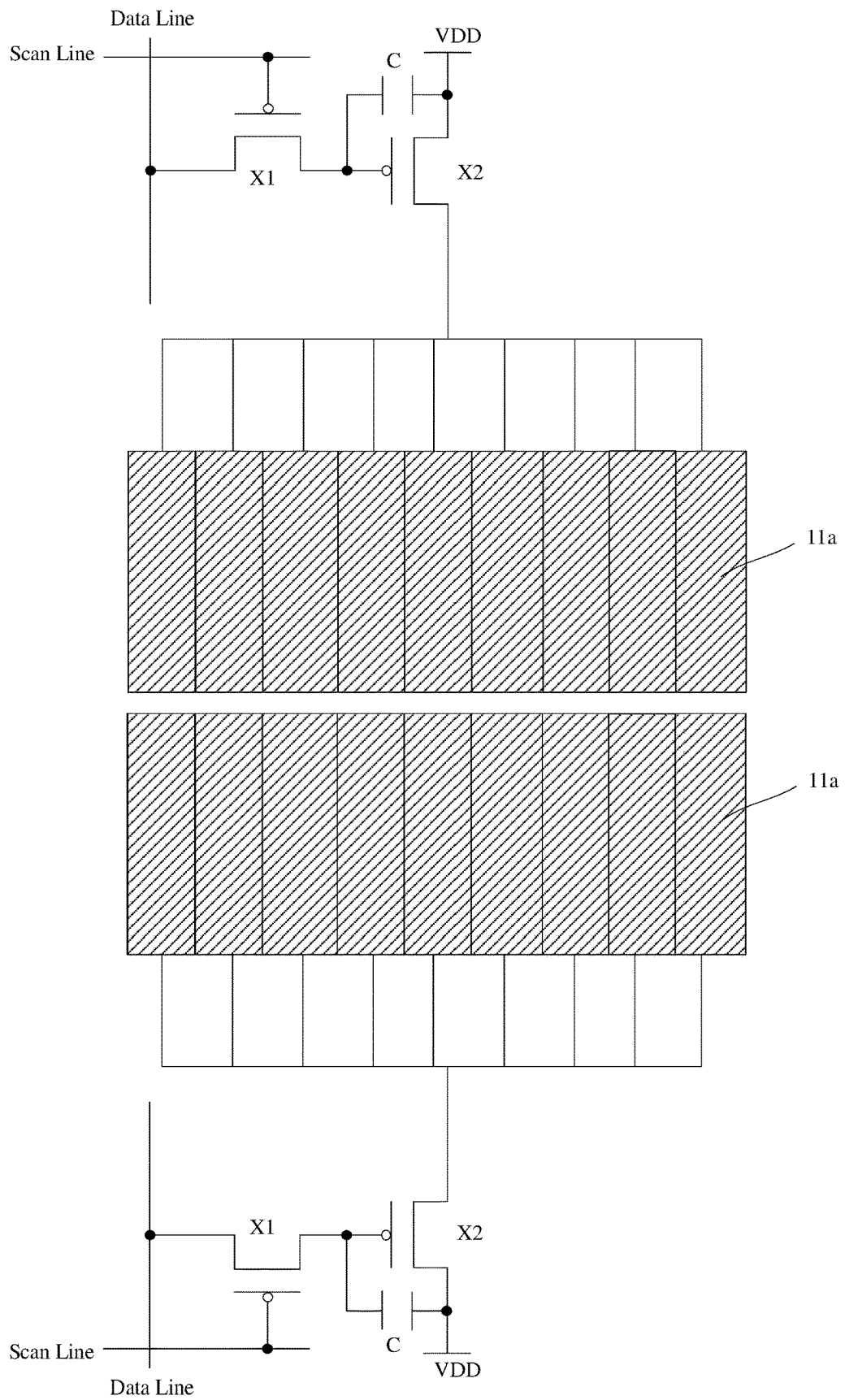
FIG. 5 is a schematic diagram of a circuit illustrating an active matrix mode of first OLED sub-pixels of the same color in two rows of the transparent OLED substrate.

FIG. 5 is a schematic diagram of a circuit illustrating an active matrix mode of first OLED sub-pixels of the same color in two rows of the transparent OLED substrate. Each pixel driving circuit includes a switching transistor X1, a driving transistor X2, and a storage capacitor C. Referring to FIG. 5, first electrodes of first OLED sub-pixels 11a in the first row are coupled to a drain electrode of the driving transistor X2 in one pixel driving circuit, first electrodes of first OLED sub-pixels 11a in the second row are coupled to a drain electrode of a driving transistor X2 in another one pixel driving circuit, and second electrodes of all the first OLED sub-pixels 11a are coupled to the ground. A gate electrode of the driving transistor X2 in the pixel driving circuit for the first row is corresponding to one data signal, and the data signal is coupled to the gate electrode of the driving transistor X2 via a switching transistor X1. A gate electrode of the driving transistor X2 in the pixel driving circuit for the second row is corresponding to another data signal, and the data signal is coupled to the gate electrode of the driving transistor X2 via another switching transistor X1. Source electrodes of the two driving transistors are corresponding to one power supply voltage (Voltage Drain Drain, VDD).

The pixel driving circuit for the first row may be disposed in the upper bezel region of the transparent OLED substrate 11. The pixel driving circuit for the second row may be disposed in the lower bezel region of the transparent OLED substrate 11.

The data line of the upper pixel driving circuit may be coupled to one data signal channel (data line) of the display driver integrated chip (DDIC); the data line of the lower pixel driving circuit may be coupled to another data signal channel (data line) of the display driver integrated chip (DDIC). Scan lines of the upper and lower pixel driving circuits may be coupled to one scan signal channel of the GIP circuit.

Figure 6:
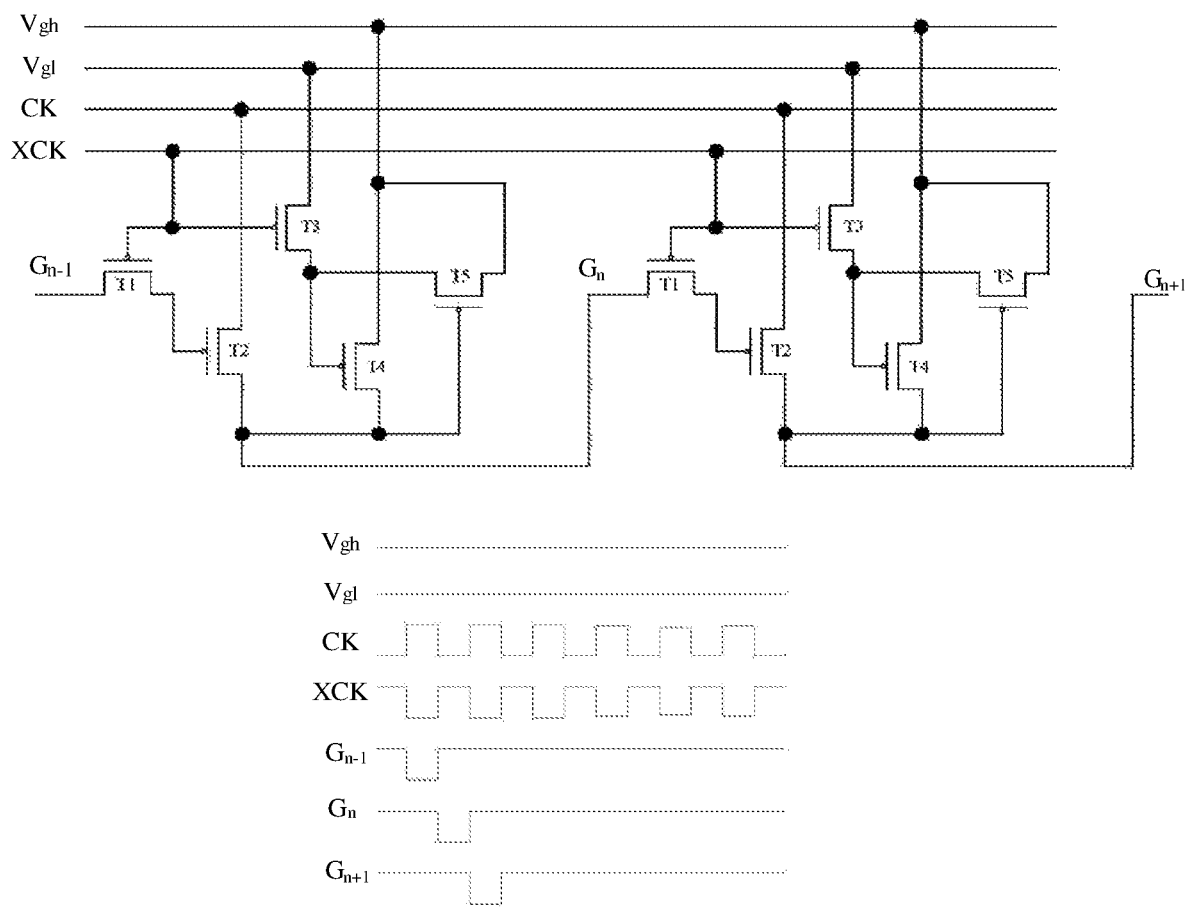
FIG. 6 is a structural diagram and a timing diagram of a GIP circuit.

FIG. 6 is a structural diagram and a timing diagram of a GIP circuit. Referring to FIG. 6, a stage of a GIP circuit includes a first transistor T1, a second transistor T2, a third transistor T3, a fourth transistor T4, and a fifth transistor T5. A first clock signal line XCK is coupled to a gate electrode of the first transistor T1 and a gate electrode of the third transistor T3, and a second clock signal line CK is coupled to a source electrode of the second transistor T2. A first gate line $V_{gh}$ is coupled with a source electrode of the fourth transistor T4 and a source electrode of the fifth transistor T5, and a second gate line $V_{gl}$ is coupled to a source electrode of the third transistor T3. The GIP circuit may include a plurality of stages of GIP circuits. The source electrode of the first transistor T1 of the nth stage of the GIP circuit is coupled to an input signal line $G_n$, which inputs a signal for the nth stage of the GIP circuit. The drain electrode of the second transistor T2 of the nth stage of the GIP circuit is coupled to an output signal line of the nth stage of the GIP circuit, and the output signal of the nth stage of the GIP circuit serves as the input signal $G_{n+1}$ of the (n+1)th stage of the GIP circuit.

Referring to a waveform diagram of driving the GIP circuit in FIG. 6. The first gate line $V_{gh}$ is at a high level, the second gate line $V_{gl}$ is at a low level, and the first clock signal line XCK as well as the second clock signal line CK output digital signals with opposite high and low levels, respectively. When the first clock signal line XCK jumps to a low level, a low level is input to the scan line $G_1$ of the first stage of the GIP circuit, and when the second clock signal line CK jumps to a low level, the first stage of the GIP circuit outputs a low-level signal as the input signal of the second stage of the GIP circuit. That is, a low level is input to the scan line $G_2$ of the second stage of the GIP circuit, and so on. In this way, the output signal of the nth stage of the circuit is taken as the input signal of the (n+1)th stage of the circuit.

Figure 7:
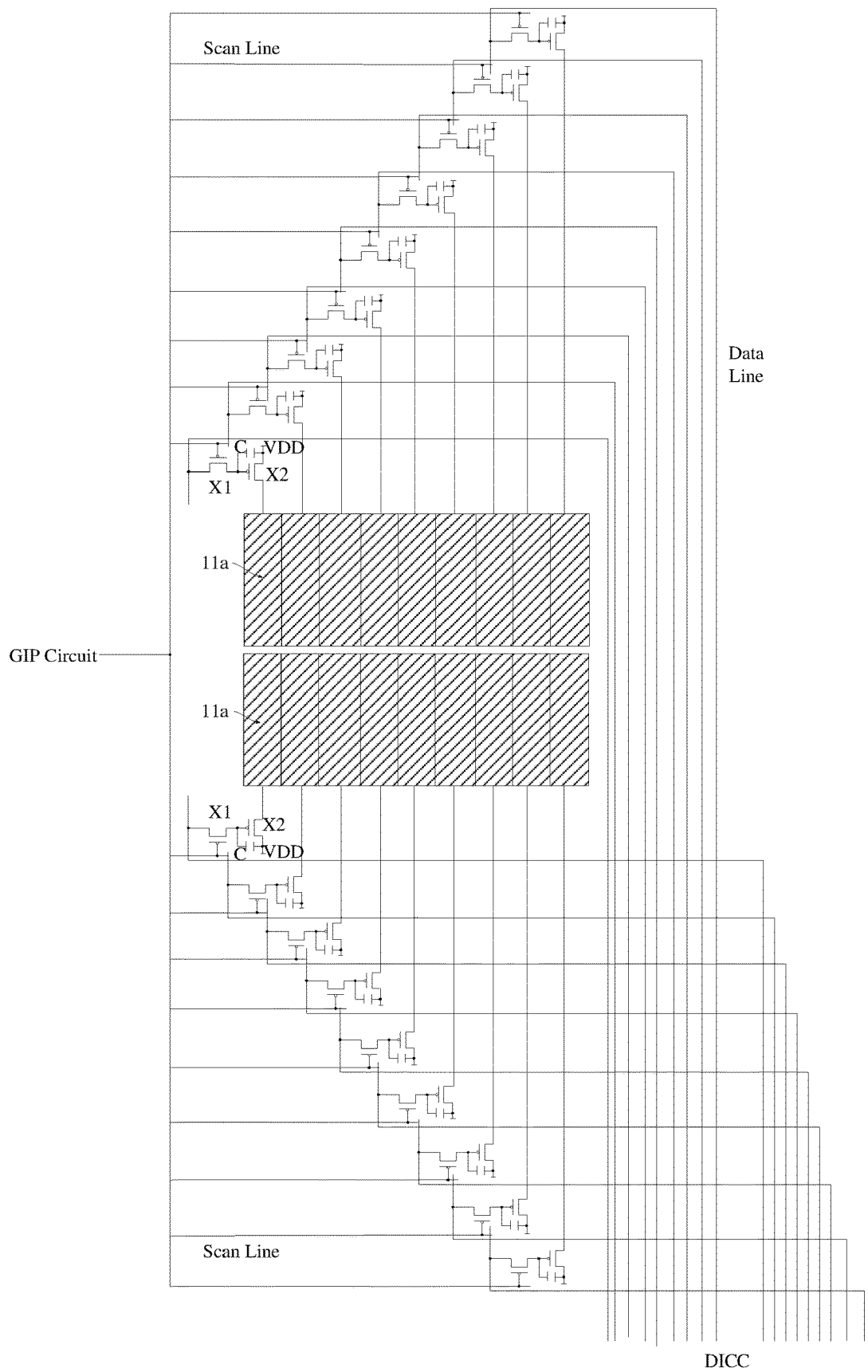
FIG. 7 is another schematic diagram of a circuit illustrating an active matrix mode of first OLED sub-pixels of the same color in two rows of the transparent OLED substrate.

FIG. 7 is another schematic diagram of a circuit illustrating an active matrix mode of first OLED sub-pixels in two rows of the transparent OLED substrate. Referring to FIG. 7, first electrodes of first OLED sub-pixels 11a in the first row are coupled to drain electrodes of driving transistors X2 in respective pixel driving circuits, and first electrodes of first OLED sub-pixels 11a in the second row are coupled to drain electrodes of driving transistors X2 in respective pixel driving circuits; and second electrodes of all the first OLED sub-pixels 11a are coupled to the ground. The driving transistor in each pixel driving circuit has a gate electrode corresponding to one data signal, and the data signal is coupled to the gate electrode of the driving transistor via a switching transistor. Source electrodes of the driving transistors are corresponding to a single one power supply voltage (VDD).

In FIG. 7, one pixel driving circuit includes a transistor array, and each transistor unit in the transistor array includes: a switching transistor X1, a driving transistor X2, and a storage capacitor C. The pixel driving circuits coupled to the first electrodes of first OLED sub-pixels 11a in the first row may be disposed in the upper bezel region of the transparent OLED substrate 11. The pixel driving circuits coupled to the first electrodes of first OLED sub-pixels 11a in the second row may be disposed in the lower bezel region of the transparent OLED substrate 11.

Data lines in transistor units of the upper pixel driving circuits may be coupled to one data signal channel (data line) of the display driver integrated chip (DDIC); and data lines in the transistor units of the lower pixel driving circuits may be coupled to one data signal channel (data line) of the display driver integrated chip (DDIC). Scan lines in the transistor units of the upper and lower pixel driving circuits may be coupled to one scan signal channel of the GIP circuit. In other words, the data lines in the transistor units occupy one data signal channel of the display driver integrated chip, and the scan lines in the transistor units occupy one scan signal channel of the GIP circuit.

Figure 8:
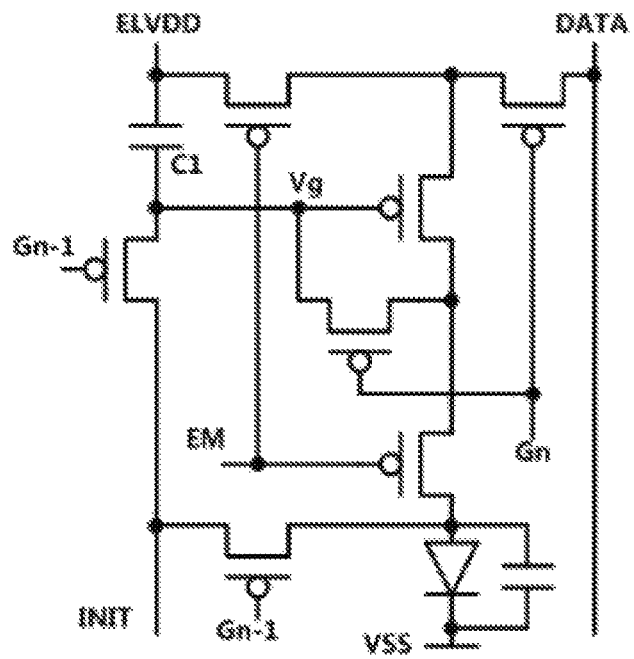
FIG. 8 is a circuit diagram and a timing diagram illustrating a pixel driving circuit having a function of compensating for a threshold voltage of a driving transistor.
Figure 8:
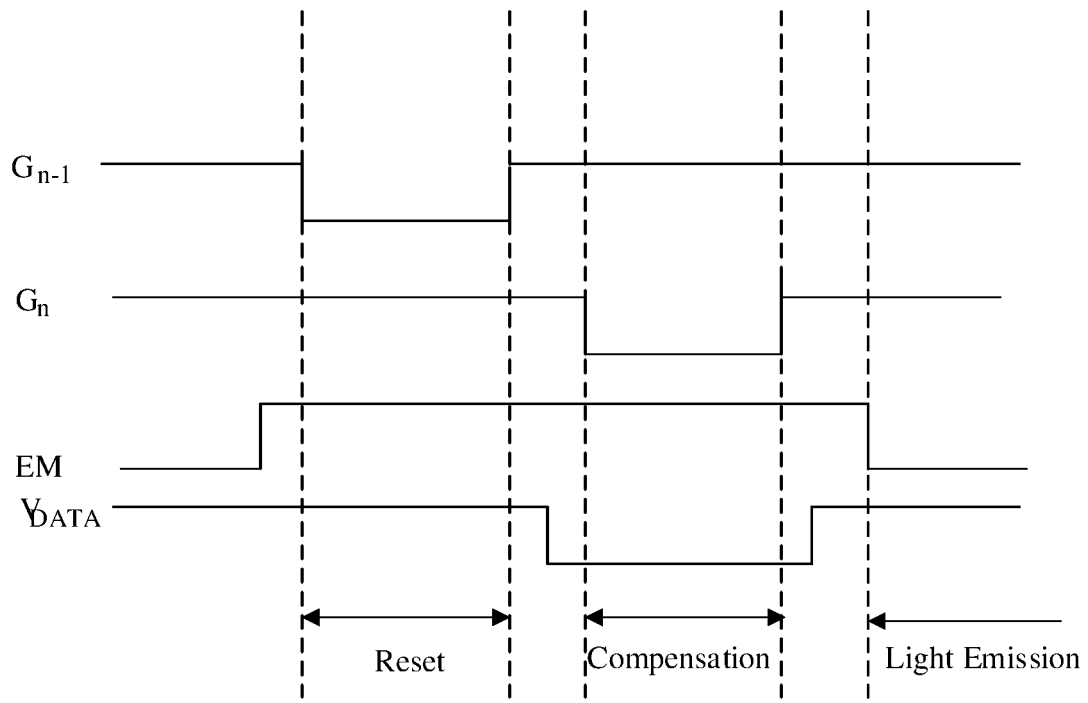

FIG. 8 is a circuit diagram and a timing diagram illustrating a pixel driving circuit having a function of compensating for a threshold voltage of a driving transistor. In the specific implementation, in addition to the above 2T1C structure (including the structure of two transistors and one storage capacitor), the pixel driving circuit may also be a pixel driving circuit that compensates for a threshold voltage of the driving transistor, such as 7T1C and 6T1C. The 7T1C pixel driving circuit shown in FIG. 8 is operated in three working stages: a reset stage, a compensation stage, and a light emitting stage. In the compensation stage, the threshold voltage Vth of the driving transistor is first stored in its gate-source voltage Vgs. In the final light emitting stage, a difference between Vgs and Vth is converted into current. Since Vgs already contains Vth, when the difference is converted into current, the effect of the Vth is offset, thereby achieving the current consistency. The pixel driving circuit shown in FIG. 8 may improve the lifespan and display uniformity of the first OLED sub-pixel 11a.

In the case of the first electrodes of the first OLED sub-pixels 11a in the first row (also referred to as a first OLED pixel row) coupling to a drain electrode of a driving transistor of one pixel driving circuit, the driving transistor has the gate electrode corresponding to one data signal of the display driver chip, and the source electrode corresponding to a power supply voltage while the first electrodes of first OLED sub-pixels 11a in the second row (also referred to as a second OLED pixel row) coupling to a drain electrode of a driving transistor in another one pixel driving circuit, the driving transistor has the gate electrode corresponding to another data signal of the display driver chip, and the source electrode corresponding to the power supply voltage (see FIG. 5), a signal VDATA of the data line in the pixel driving circuit for the first OLED sub-pixels 11a in the first row may be from one data signal channel (data line) of the display driver integrated chip (DDIC); and a signal VDATA of the data line in the pixel driving circuit for the first OLED sub-pixels 11a in the second row may be from another data signal channel (data line) of the display driver integrated chip (DDIC); signals of scan lines $G_{n-1}$, $G_n$ in the pixel driving circuits for the first OLED sub-pixels 11a in the first and second rows may be from two scan signal channels of the GIP circuit; emitting signals EM in the pixel driving circuits may be from one emitting signal channel of the GIP circuit; and initiating signals INIT in the pixel driving circuits may be from the display driver integrated chip.

In the case of the first electrodes of first OLED sub-pixels 11a in the first row and the second row coupling to drain electrodes of driving transistors in the respective pixel driving circuits, the gate electrode of the driving transistor in each pixel driving circuit corresponding to one data signal of the display driver chip, and the source electrode thereof corresponding to the same power supply voltage or different power supply voltages (see FIG. 7), a signal VDATA of the data line in the pixel driving circuit for each first OLED sub-pixel 11a in the first row and in the second row may be from one data signal channel (data line) of the display driver integrated chip (DDIC), that is, signals VDATA of the data lines in the pixel driving circuits for a plurality of first OLED sub-pixels 11a in the first row and in the second row may be from a plurality of data signal channels (data lines) of the display driver integrated chip (DDIC); signals of scan lines $G_{n-1}$, $G_n$ in the pixel driving circuits for the OLED sub-pixels 11a in the first and second rows may be from two scan signal channels of the GIP circuit; emitting signals EM may be from one emitting signal channel of the GIP circuit; and initiating signals INIT may be from the display driver integrated chip.

Comparing FIG. 5 with FIG. 7, the former has fewer data signal channels, fewer connection traces, and a smaller occupied area.

Figure 9:
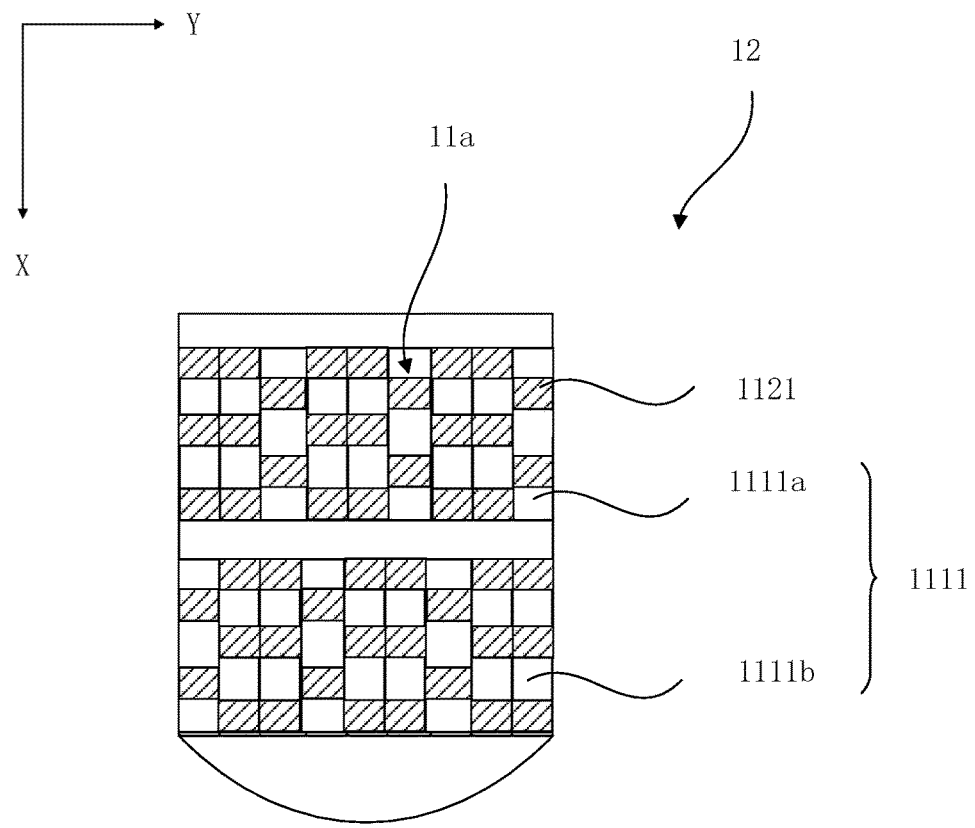
FIG. 9 is a top view of a transparent OLED substrate in a second embodiment of the present disclosure.

FIG. 9 is a top view of a transparent OLED substrate in a second embodiment of the present disclosure. The transparent OLED substrate 12 shown in FIG. 9 is substantially the same as the transparent OLED substrate 11 shown in FIG. 1, except that a plurality of light emitting structures 1121 are provided spaced apart on one first electrode 1111a/1111b. The light emitting structures 1121, which are spaced apart, are separated by a corresponding pixel definition layer 114 or no pixel definition layer 114 is provided between the light emitting structures 1121 spaced apart.

The transparent OLED substrate 12 may increase a pixel density of the first OLED sub-pixels 11a on the transparent OLED substrate 12. In addition, whether one or more light emitting structures 1121 are provided on the first electrode 1111a, the light emitting drive of the first OLED sub-pixels 11a on the transparent OLED substrate 12 is not affected.

Figure 10:
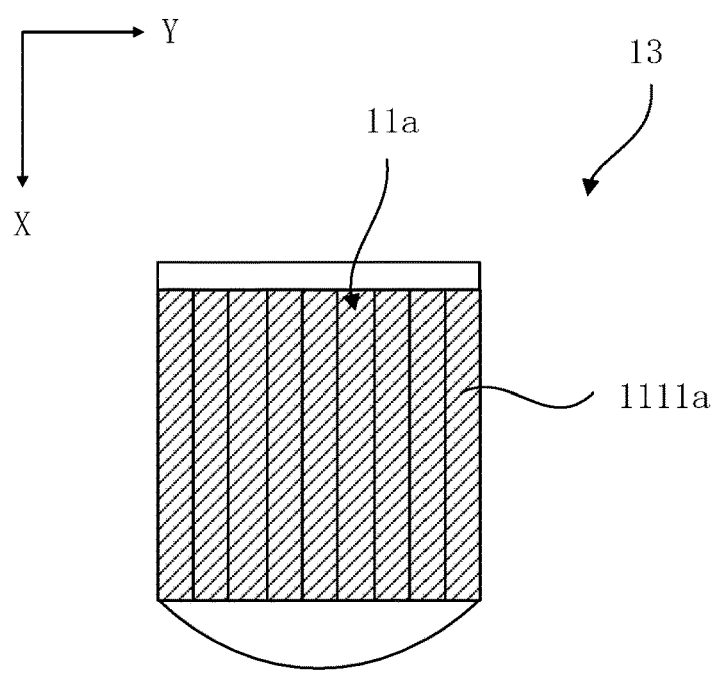
FIG. 10, is a top views of a transparent OLED substrate in a third embodiment of the present disclosure.
Figure 11:
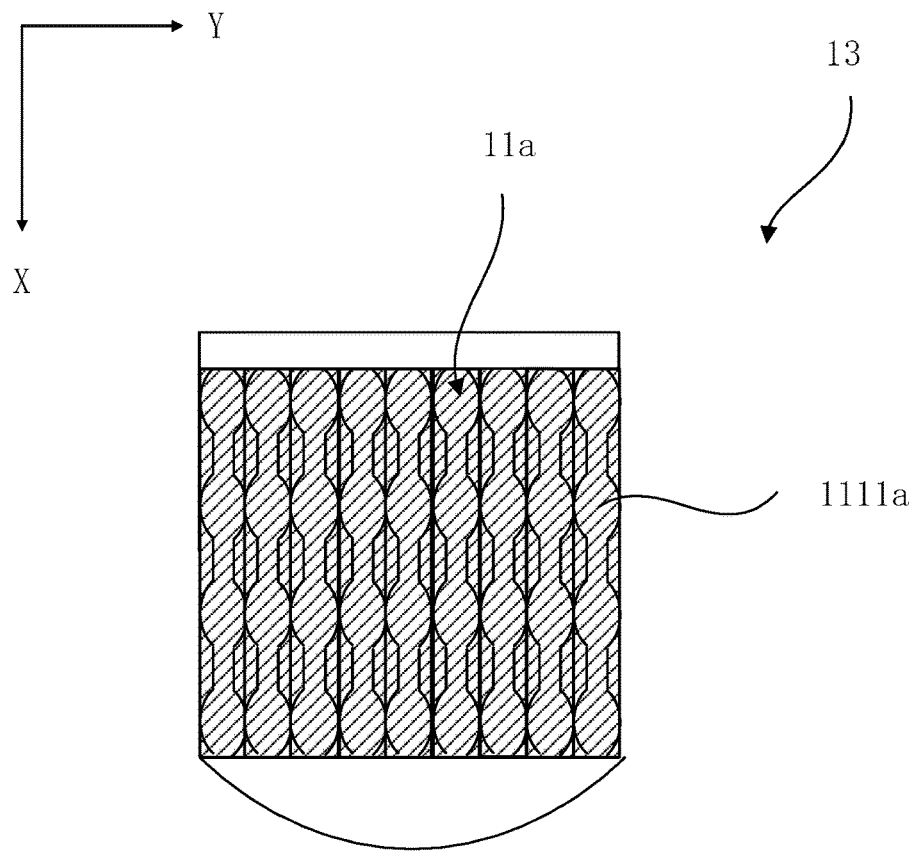
FIG. 11 is a top view of a transparent OLED substrate in a third embodiment of the present disclosure.
Figure 12:
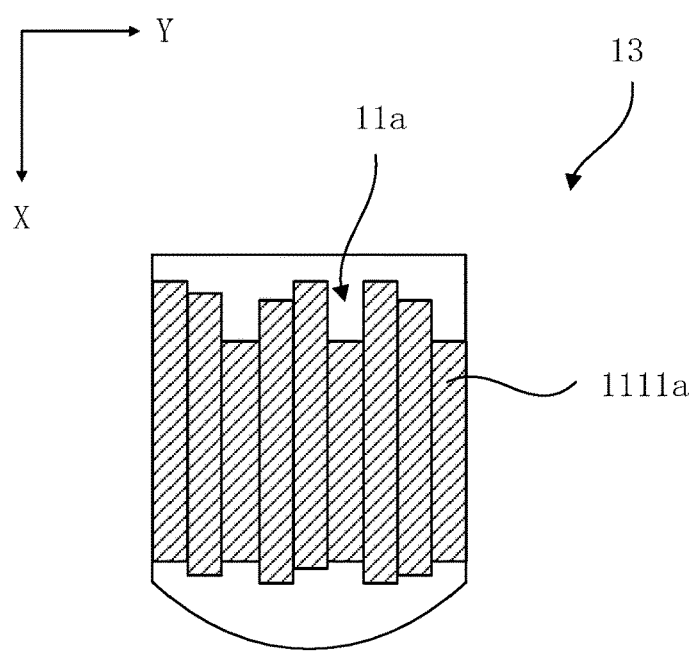
FIG. 12 is a top view of a transparent OLED substrate in a third embodiment of the present disclosure.

FIG. 10, FIG. 11 and FIG. 12 are top views of a transparent OLED substrate in a third embodiment of the present disclosure. The transparent OLED substrate 13 shown in FIG. 10 is substantially the same as the transparent OLED substrate 11 shown in FIG. 1, except that an electrode group 1111 includes one first electrode 1111a.

The structure shown in FIG. 10 is such a structure: based on the structure shown in FIG. 1, the first electrodes 1111b in the second row are removed, and the first electrodes 1111a of the first row are extended in the X direction to the bottom end of the transparent OLED substrate 13; or the first electrodes 1111a in the first row are removed, and the first electrodes 1111b of the second row are extended in the X direction to the top end of the transparent OLED substrate 13. As such, the structure of each first OLED sub-pixel 11a in the embodiment is substantially the same as the structure of each first OLED sub-pixel 11a in the first row or each first OLED sub-pixel 11a in the second row in FIGS. 1 and 9.

A projection of the first electrode 1111a on the base substrate 110 may include one graphic unit, or two or more graphic units. The graphic unit in FIG. 10 is rectangular, and the graphic unit in FIG. 11 is gourd-shaped. Alternatively, the graphic unit may also be oval, dumbbell-shaped, or circular. The above-mentioned pattern may enable the diffraction pattern to overlap and cancel each other out, thereby mitigating the diffraction problem.

The driving mode of the first OLED sub-pixels 11a in the embodiment corresponds to the driving mode of the first OLED sub-pixels 11a in the first row or corresponds to the driving mode of the first OLED sub-pixels 11a in the second row in FIG. 1, which will not be elaborated herein in the present disclosure.

In FIG. 12, the first OLED sub-pixels 11a may extend upward and downward in the X direction from a certain section in the middle of the transparent OLED substrate 13, extend downward from the top to the middle of the transparent OLED substrate 13 in the X direction, or extend from the middle to the bottom end in the X direction. When the transparent OLED substrate 13 includes two rows and multiple columns of first OLED sub-pixels 11a, the first OLED sub-pixels 11a in the first row may extend upward and downward along the X direction in the transparent OLED substrate 13. Specifically, the first OLED sub-pixels 11a in the first row may extend along a vertical direction from an upper middle section, extend downward from the top of the OLED substrate 13 to the upper middle section, or extend from the upper middle section to the middle section. And the first OLED sub-pixels 11a in the second row may extend upward and downward along the X direction in the transparent OLED substrate 13. Specifically, the first OLED sub-pixels 11a in the first row may extend along a vertical direction from a lower middle section, extend upward from the bottom to the lower middle section of the OLED substrate 13, or extend from the lower middle section to the middle section. Different from the above solution where different patterns are achieved by applying different driving current levels to the first electrodes, and/or by applying driving currents to sub-pixels of different colors, first OLED sub-pixels in the present embodiment may form various patterns in combination with different patterns of the sub-pixels.

Figure 13:
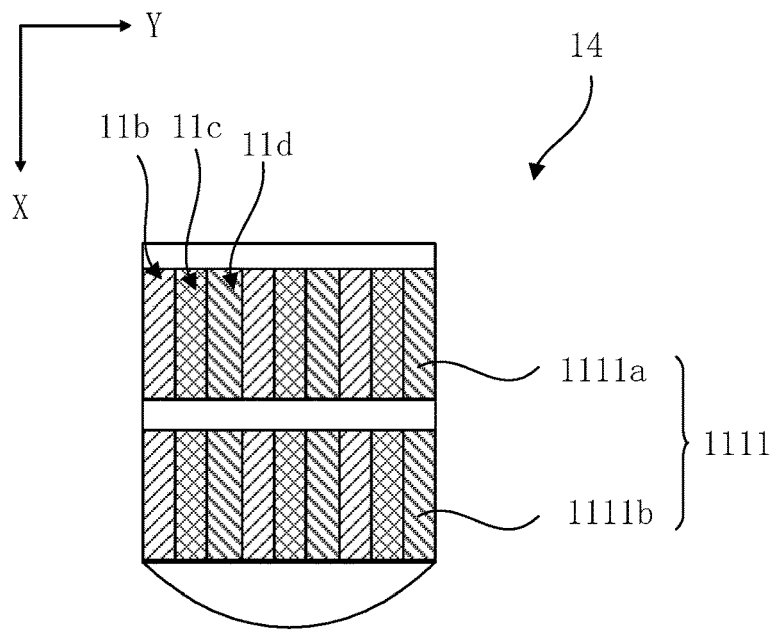
FIG. 13 is a top view of a transparent OLED substrate in a fourth embodiment of the present disclosure.

FIG. 13 is a top view of a transparent OLED substrate in a fourth embodiment of the present disclosure. The transparent OLED substrate 14 shown in FIG. 13 is substantially the same as the transparent OLED substrate 11 shown in FIG. 1 except that n=3.

In other words, the colors of the light emitting structures 1121 on the first electrodes 1111a/1111b in the same row and different columns are alternately arranged based on the same rule, and adjacent three columns of first OLED sub-pixels 11b, 11c, 11d with different colors form one OLED pixel unit. In the OLED pixel unit, the first OLED sub-pixels 11b, 11c, and 11d may be red, green, and blue sub-pixels, respectively. Alternatively, the first OLED sub-pixels 11b, 11c, and 11d may be sub-pixels with other colors, respectively. Alternatively, adjacent four columns of first OLED sub-pixels with different colors may also form one OLED pixel unit.

For the specific structure of the first OLED sub-pixels 11b, 11c, 11d, reference may be made to the specific structure of the first OLED sub-pixels 11a in the above embodiments. In the embodiments shown in FIGS. 1 to 12, since the first OLED sub-pixels 11a are sub-pixels of the same color, a single one first OLED sub-pixel 11a may be referred to as one OLED pixel unit. The driving mode for the sub-pixels of multiple colors will be described below.

Figure 14:
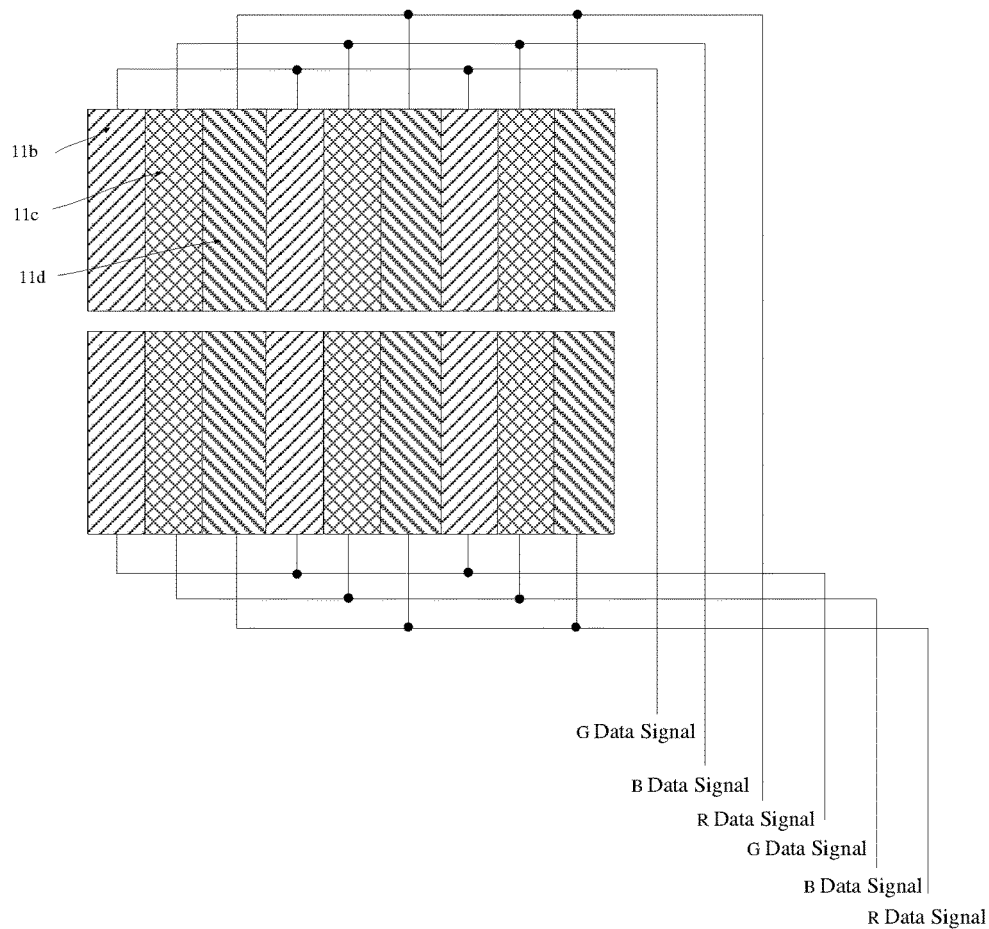
FIG. 14 is a schematic diagram of a circuit illustrating a passive matrix mode of first OLED sub-pixels in two rows of the transparent OLED substrate.

FIG. 14 is a schematic diagram of a circuit illustrating a passive matrix mode of first OLED sub-pixels in two rows of the transparent OLED substrate. Referring to FIG. 14, in the OLED pixel units in the first row, first OLED sub-pixels 11b of the same color, first OLED sub-pixels 11c of the same color, or first OLED sub-pixels 11d of the same color have first electrodes coupled to one data signal, respectively. And in the OLED pixel units in the second row, first OLED sub-pixels 11b of the same color, first OLED sub-pixels 11c of the same color, or first OLED sub-pixels 11d of the same color have first electrodes coupled to another data signal, respectively. And all of the first OLED sub-pixels 11b, 11c, and 11d have second electrodes coupled to the ground. In other words, all of the red sub-pixels in the same row have the first electrodes coupled to the same R data signal; all of the green sub-pixels have the first electrodes coupled to the same G data signal; and all of the blue sub-pixels have the first electrodes coupled to the same B data signal. The R, G, B data signals are provided by the external circuit. In FIG. 14, since the transparent OLED substrate has two rows of first OLED sub-pixels, one driving current is to be applied to first OLED sub-pixels of the same color in the first row and another one driving current is to be applied to first OLED sub-pixels of the same color in the second row. The driving currents applied to the first OLED sub-pixels of the same color in the first row may be from three data signal channels (data lines) of the display driver integrated chip (DDIC), and the driving currents applied to the first OLED sub-pixels of the same color in the second row may be from another three data signal channels (data lines) of the display driver integrated chip (DDIC). Briefly, for each of the OLED pixel rows, the first OLED sub-pixels of the same-color have the first electrodes coupled to the same data signal.

Figure 15:
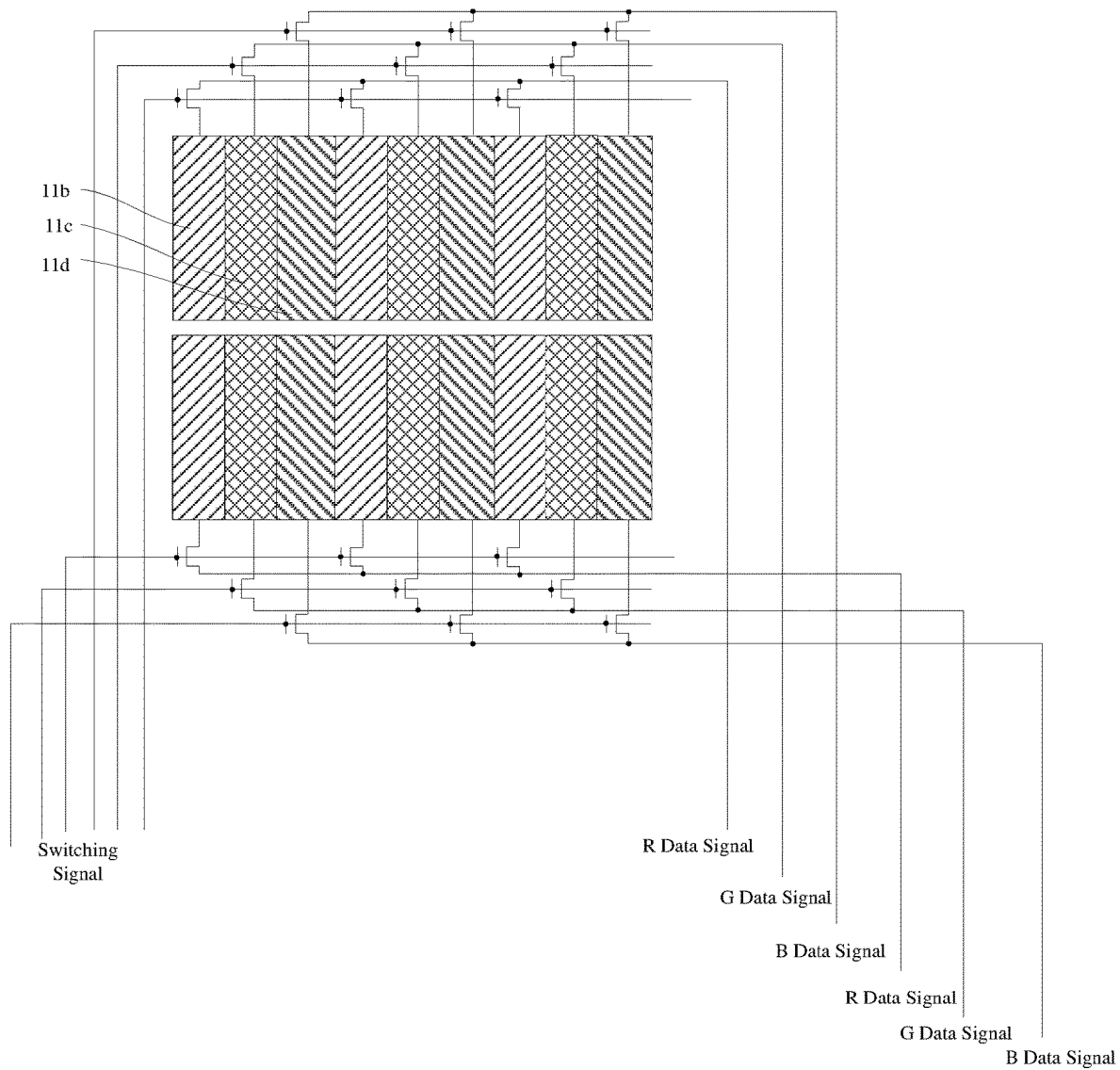
FIG. 15 is another schematic diagram of a circuit illustrating a passive matrix mode of first OLED sub-pixels in two rows of the transparent OLED substrate.

FIG. 15 is another schematic diagram of a circuit illustrating a passive matrix mode of first OLED sub-pixels in two rows of the transparent OLED substrate. Referring to FIG. 15, in the OLED pixel units in the first row, first OLED sub-pixels 11b of the same color, first OLED sub-pixels 11c of the same color, or first OLED sub-pixels 11d of the same color have second electrodes coupled to the ground, the first electrodes thereof are coupled to a drain electrode of one switching transistor, respectively. And in the OLED pixel units in the first row, the switching transistors corresponding to the first OLED sub-pixels 11b, 11c, or 11d of the same color have source electrodes coupled to a single one data signal, and gate electrodes thereof coupled to a single one switching signal. In the OLED pixel units in the second row, the switching transistors corresponding to the first OLED sub-pixels 11b, 11c, or 11d of the same color have source electrodes coupled to another one data signal, and gate electrodes thereof coupled to another one switching signal. In addition to collectively controlling all of the first OLED sub-pixels of the same color in one row to perform the display function, the switching signal, when being "off", may also control all of the first OLED sub-pixels of the same color in one row to perform light transmission function, thereby preventing crosstalk when adjacent sub-pixels of other colors are performing display functions.

Alternatively, first OLED sub-pixels of the same color in the OLED pixel units in each row have the first electrodes coupled to the drain electrode of one switching transistor, respectively. The switching transistors corresponding to the first OLED sub-pixels of the same color in the OLED pixel units in the first row have the source electrodes coupled to a single one data signal, and the gate electrodes coupled to respective switching signals. The switching transistors corresponding to the first OLED sub-pixels of the same color in the OLED pixel units in the second row have the source electrodes coupled to another one data signal, and the gate electrodes coupled to respective switching signals. Such configuration enables first OLED sub-pixels of the same color to independently perform the display function or the light transmission function.

Figure 16:
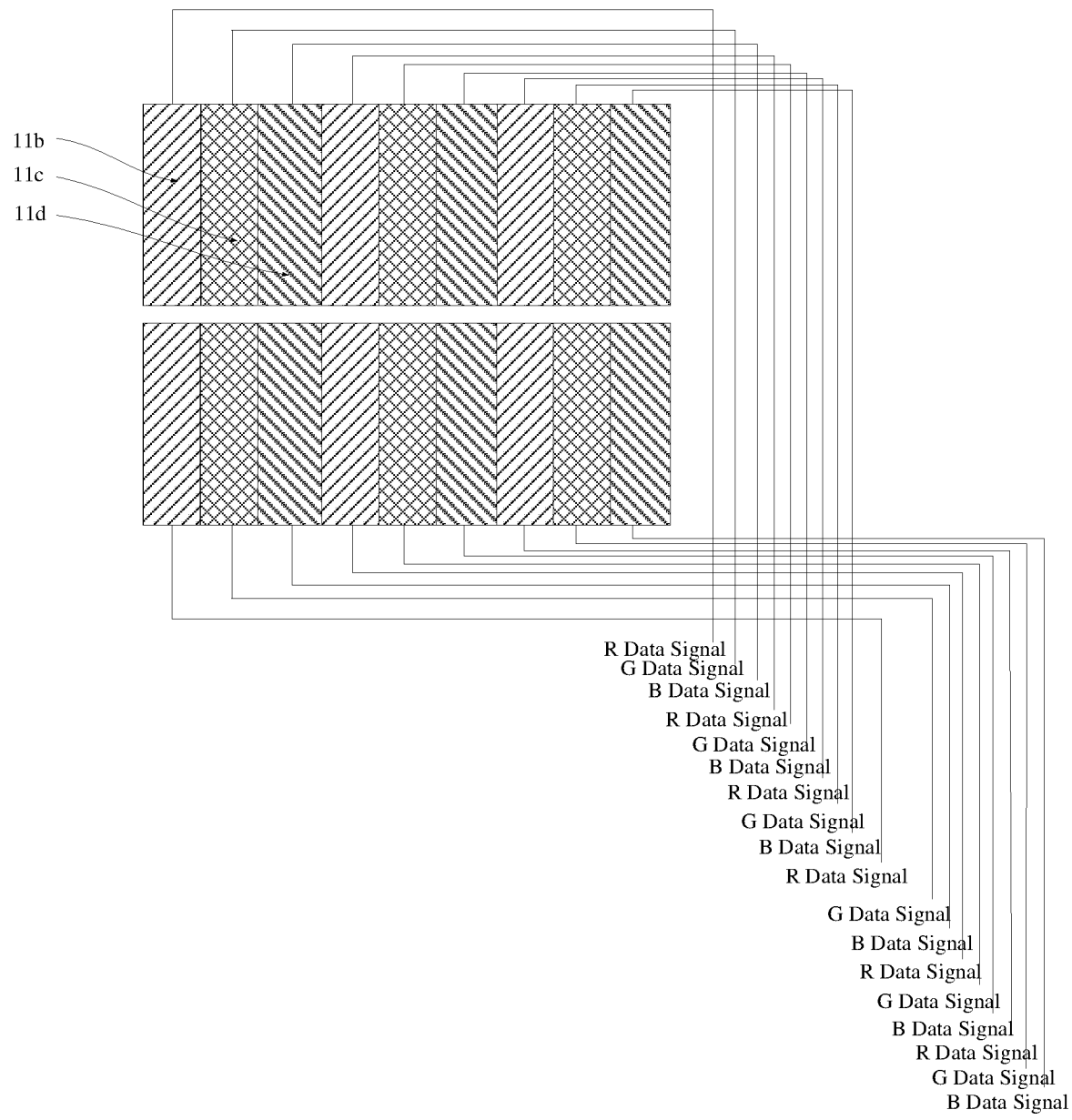
FIG. 16 is yet another schematic diagram of a circuit illustrating a passive matrix mode of first OLED sub-pixels in two rows of the transparent OLED substrate.

FIG. 16 is yet another schematic diagram of a circuit illustrating a passive matrix mode of first OLED sub-pixels in two rows of the transparent OLED substrate. In order to enable first OLED sub-pixels of the same color in each row to independently perform the display function or the light transmission function, referring to FIG. 16, first OLED sub-pixels in the OLED pixel units of the first and second rows may also have first electrodes coupled to respective data signals. The data signals are also provided by the external circuit. Since the transparent OLED substrate has two rows of first OLED sub-pixels, driving currents are to be applied to the respective first OLED sub-pixels. Each of the driving currents of the first OLED sub-pixels may be from one data signal channel (data line) of the display driver integrated chip (DDIC), and the driving currents of all the first OLED sub-pixels may be from a plurality of data signal channels (data lines) of the display driver integrated chip (DDIC).

Figure 17:
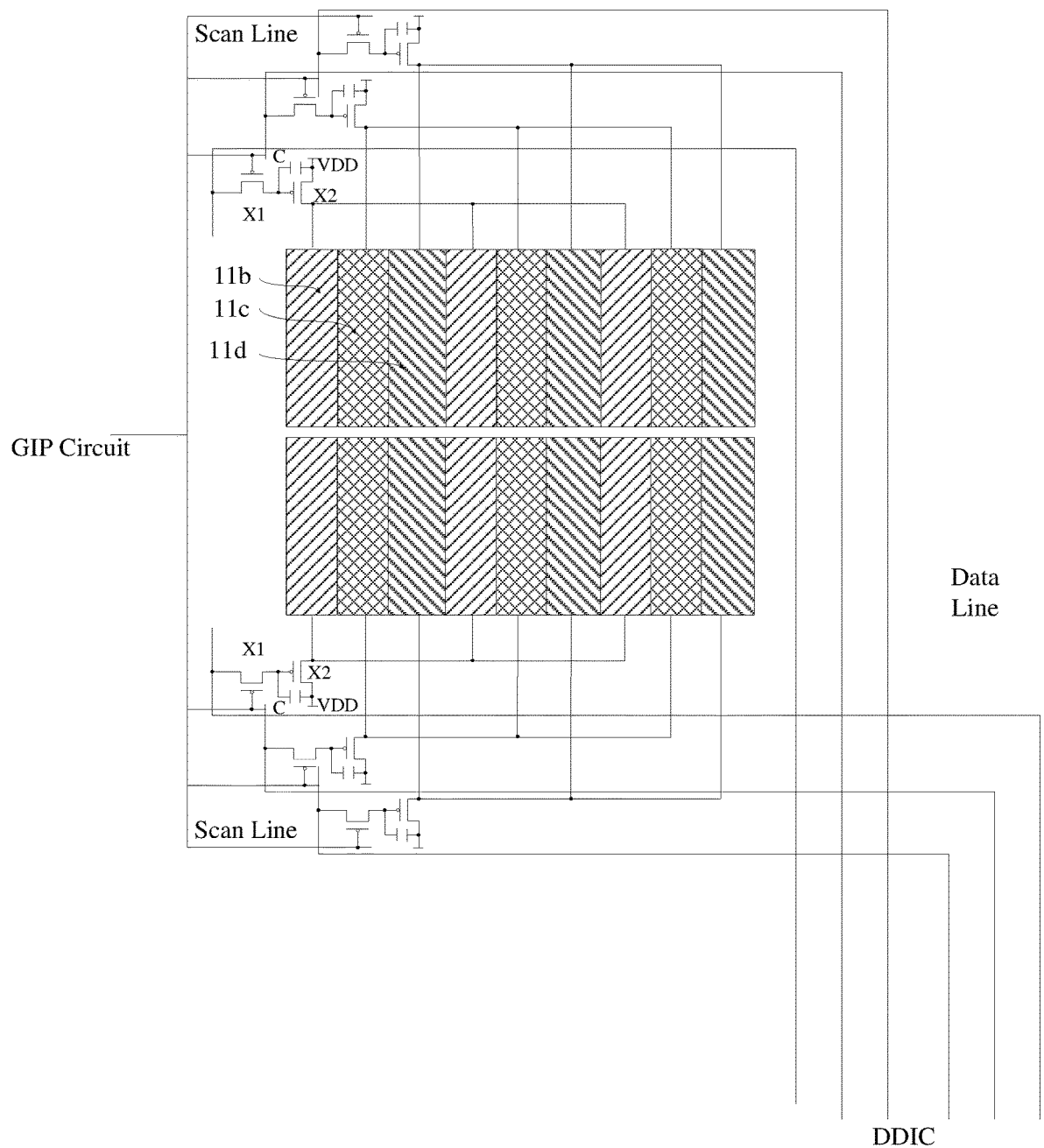
FIG. 17 is a schematic diagram of a circuit illustrating an active matrix mode of first OLED sub-pixels in two rows of the transparent OLED substrate.

FIG. 17 is a schematic diagram of a circuit illustrating an active matrix mode of first OLED sub-pixels in two rows of the transparent OLED substrate. As shown in FIG. 17, the first OLED sub-pixels have the second electrodes coupled to the ground. First OLED sub-pixels of the same color in the OLED pixel units in the first row have first electrodes respectively coupled to a drain electrode of a driving transistor in a single one pixel driving circuit. The driving transistor has a gate electrode corresponding to a single one data signal which is coupled to the gate electrode of the driving transistor via a single one switching transistor, and a source electrode corresponding to a single one power supply voltage VDD. First OLED sub-pixels of the same color in the OLED pixel units in the second row have first electrodes respectively coupled to a drain electrode of a driving transistor in another one pixel driving circuit. The driving transistor has a gate electrode corresponding to a single one data signal which is coupled to the gate electrode of the driving transistor via a single one switching transistor, and a source electrode corresponding to a single one power supply voltage VDD.

In FIG. 17, the pixel driving circuit may include a transistor array. The transistor array includes a plurality of transistor units. Each transistor unit may include: a switching transistor X1, a driving transistor X2, and a storage capacitor C. The data line in each transistor unit may be coupled to one data signal channel (data line) of the display driver integrated chip (DDIC), respectively. The scan lines in the transistor units corresponding to the first OLED sub-pixels of the same color in the OLED pixel units in the first row and the second row may be coupled to one scan signal channel of the GIP circuit. In other words, the OLED pixel units in the first row occupy three data signal channels of the display driver integrated chip (when one OLED pixel unit includes three types of first OLED sub-pixels), and the OLED pixel units in the second row occupy another three data signal channels of the display driver integrated chip.

Alternatively, first OLED sub-pixels in the OLED pixel units in the first row have first electrodes coupled to drain electrodes of driving transistors in respective pixel driving circuits. Each of the driving transistors has a gate electrode corresponding to one data signal which is coupled to the gate electrode of the driving transistor via a single one switching transistor, and a source electrode corresponding to a single one power supply voltage VDD. The pixel driving circuit may include a transistor array. Each transistor unit in the transistor array may include a switching transistor X1, a driving transistor X2, and a storage capacitor C, which is referred to as a 2T1C structure. Each of the data lines of the transistor units may be coupled to a single one data signal channel (data line) of the display driver integrated chip (DDIC); each of the scan lines of the transistor units may be coupled to a single one scan signal channel of the GIP circuit. In other words, each first OLED sub-pixel occupies one data signal channel of the display driver integrated chip and one scan signal channel of the GIP circuit.

In the specific implementation, in addition to the above-mentioned 2T1C structure, the pixel driving circuit may also be a 6T1C structure, a 7T1C structure, or the like. The signals VDATA of the data lines of the pixel driving circuits may be from one data signal channel (data line) of the display driver integrated chip (DDIC); signals of the scan lines $G_{n-1}$ and $G_n$ thereof may be from two scan signal channels of the GIP circuit; the emitting signals EM thereof may be from one transmission signal channel of the GIP circuit; and the initial signals INIT thereof may be from the display driver integrated chip.

Figure 18:
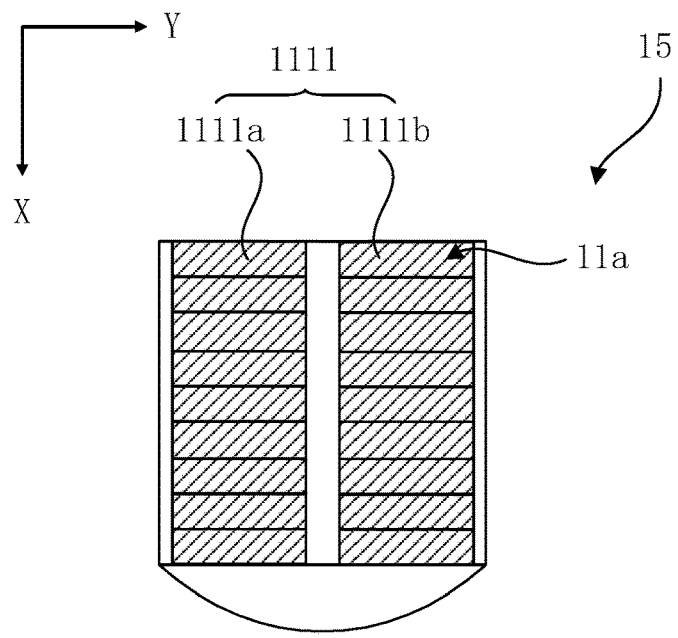
FIG. 18 is a top view of a transparent OLED substrate in a fifth embodiment of the present disclosure.

FIG. 18 is a top view of a transparent OLED substrate in a fifth embodiment of the present disclosure. Referring to FIG. 18, the structure of the transparent OLED substrate 15 in the embodiment has the difference from the structure of the transparent OLED substrates 11, 12, 13, 14 in FIGS. 1 to 17 in that, the first direction Y is a column direction, and the second direction X is a row direction. In other words, the first electrode extends in the Y direction.

The difference in terms of light emitting drive is described as follows.

Figure 19:
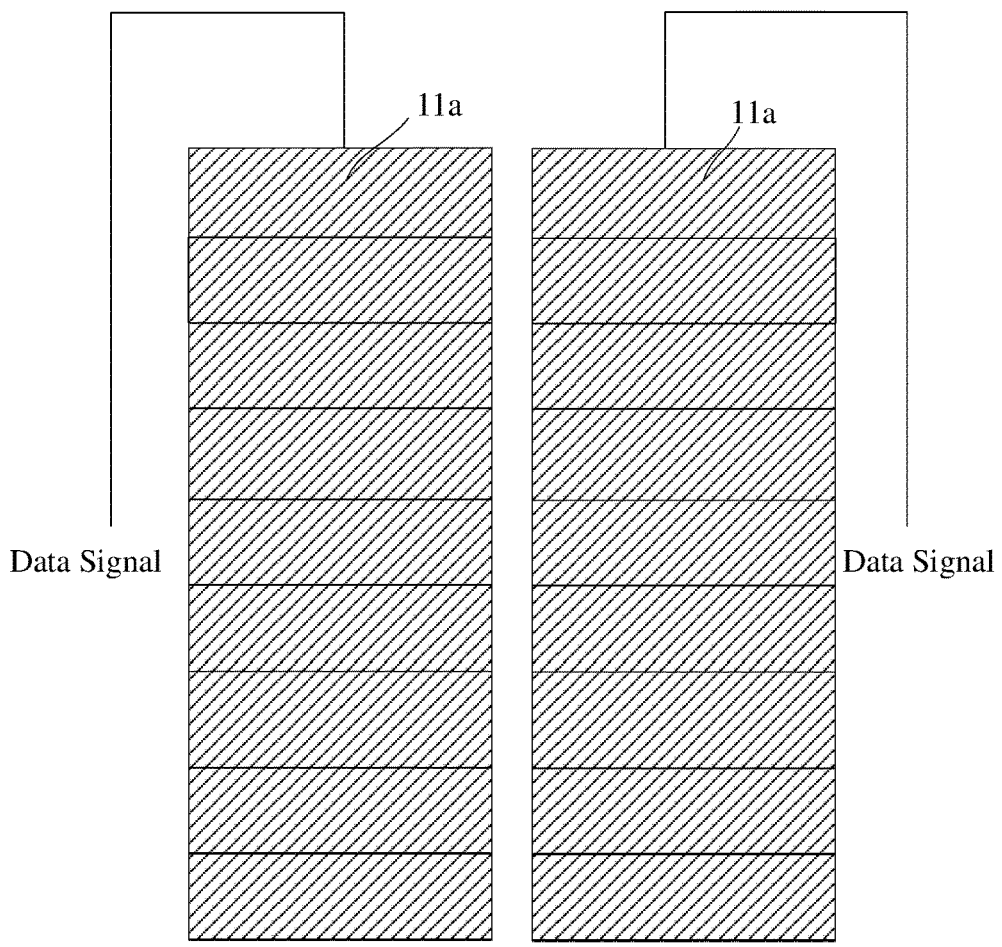
FIG. 19 is a schematic diagram of a circuit illustrating a passive matrix mode of first OLED sub-pixels of the same color in two columns of the transparent OLED substrate.

FIG. 19 is a schematic diagram of a circuit illustrating a passive matrix mode of first OLED sub-pixels of the same color in two columns of the transparent OLED substrate. Referring to FIG. 19, first OLED sub-pixels 11a in the first column have first electrodes coupled to a single one data signal; first OLED sub-pixels 11a in the second column have first electrodes coupled to another one data signal; and all of the first OLED sub-pixels 11a have second electrodes coupled to the ground. The color data carried by the two data signal channels is consistent with the color of the corresponding first OLED sub-pixel 11a. As shown in FIG. 19, data signal traces corresponding to the first OLED sub-pixels 11a in the first column may be disposed in a bezel region on a left side, and data signal traces corresponding to the first OLED sub-pixels 11a in the second column may be disposed in a bezel region on a right side.

Figure 20:
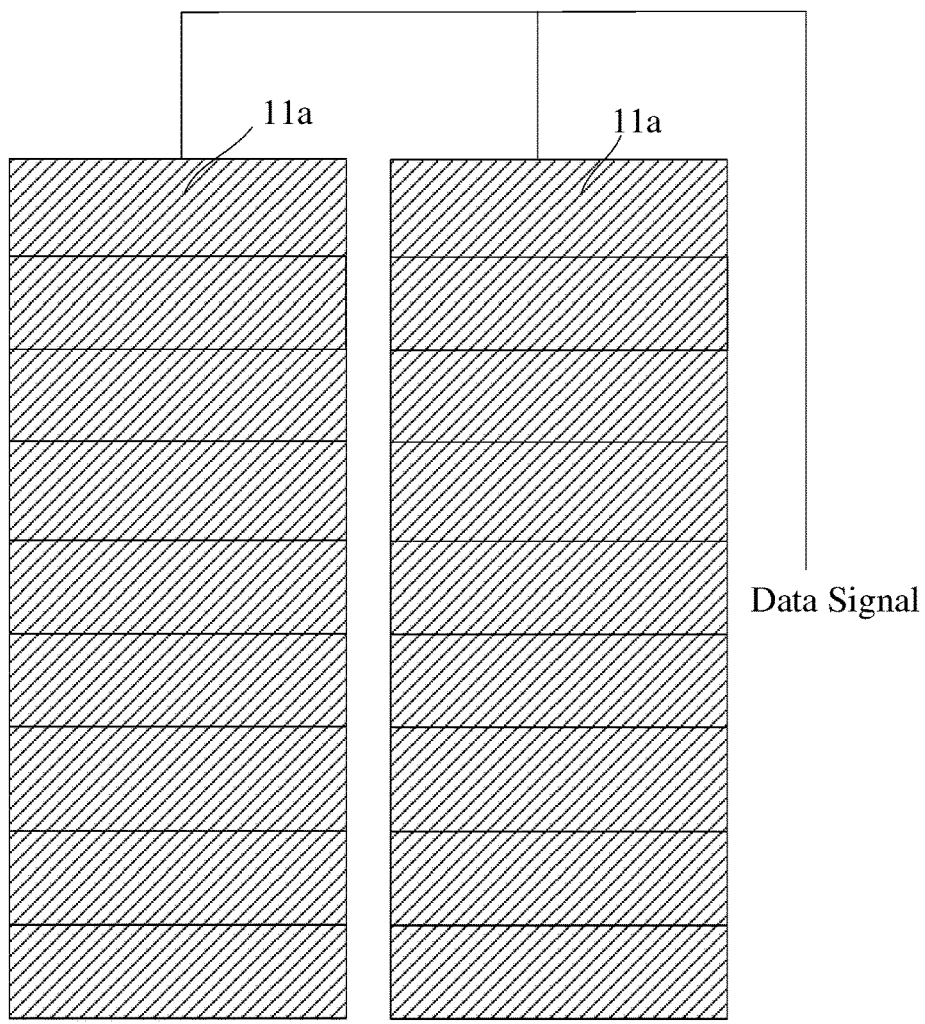
FIG. 20 is another schematic diagram of a circuit illustrating a passive matrix mode of first OLED sub-pixels of the same color in two columns of the transparent OLED substrate.

FIG. 20 is another schematic diagram of a circuit illustrating a passive matrix mode of first OLED sub-pixels of the same color in two columns of the transparent OLED substrate. Referring to FIG. 20, first OLED sub-pixels 11a in the first column and the second column have first electrodes coupled to the same data signal.

Figure 21:
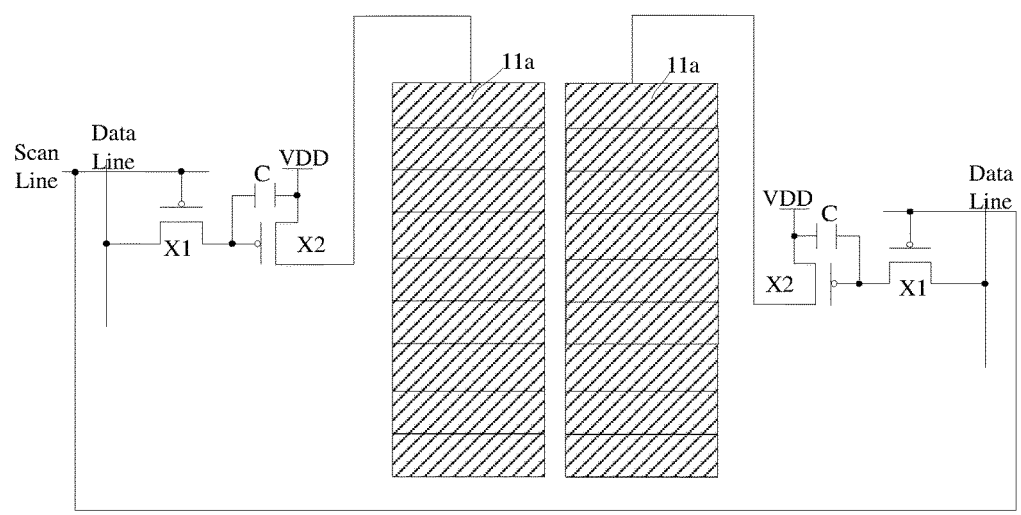
FIG. 21 is a schematic diagram of a circuit illustrating an active matrix mode of first OLED sub-pixels of the same color in two columns of the transparent OLED substrate.

FIG. 21 is a schematic diagram of a circuit illustrating an active matrix mode of first OLED sub-pixels of the same color in two columns of the transparent OLED substrate. Referring to FIG. 21, first OLED sub-pixels 11a in the first column have first electrodes coupled to a drain electrode of a driving transistor of one pixel driving circuit. The driving transistor has a gate electrode coupled to one data signal which is coupled to the gate electrode of the driving transistor via one switching transistor, and a source electrode corresponding to one power supply voltage. First OLED sub-pixels 11a in the second column have first electrodes coupled to a drain electrode of a driving transistor of another one pixel driving circuit. The driving transistor has a gate electrode coupled to one data signal which is coupled to the gate electrode of the driving transistor via one switching transistor, and a source electrode corresponding to one power supply voltage. The two pixel driving circuits have scan lines coupled to the same scan signal of the GIP circuit.

The pixel driving circuit in FIG. 21 takes a 2T1C structure as an example, and alternatively, it may also be a 3T1C structure, a 6T1C structure, a 7T1C structure, and so on.

Figure 22:
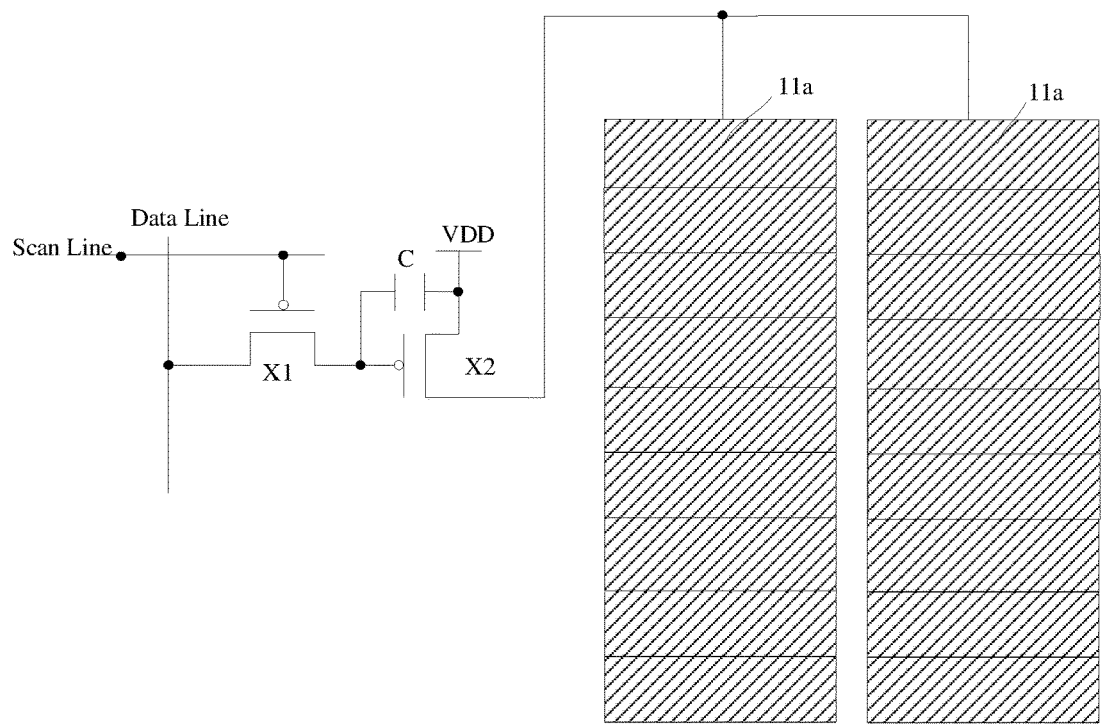
FIG. 22 is another schematic diagram of a circuit illustrating an active matrix mode of first OLED sub-pixels of the same color in two columns of the transparent OLED substrate.

FIG. 22 is another schematic diagram of a circuit illustrating an active matrix mode of first OLED sub-pixels of the same color in two columns of the transparent OLED substrate. Referring to FIG. 22, first OLED sub-pixels 11a in the first column and the second column have first electrodes coupled to a drain electrode of a driving transistor of one pixel driving circuit. The driving transistor has a gate electrode coupled to one data signal which is coupled to the gate electrode of the driving transistor via one switching transistor, and a source electrode corresponding to one power supply voltage VDD. The pixel driving circuit has a scan line coupled to one scan signal of the GIP circuit.

The pixel driving circuit in FIG. 22 takes a 2T1C structure as an example, and alternatively, it may also be a 3T1C structure, a 6T1C structure, a 7T1C structure, and so on.

Figure 23:
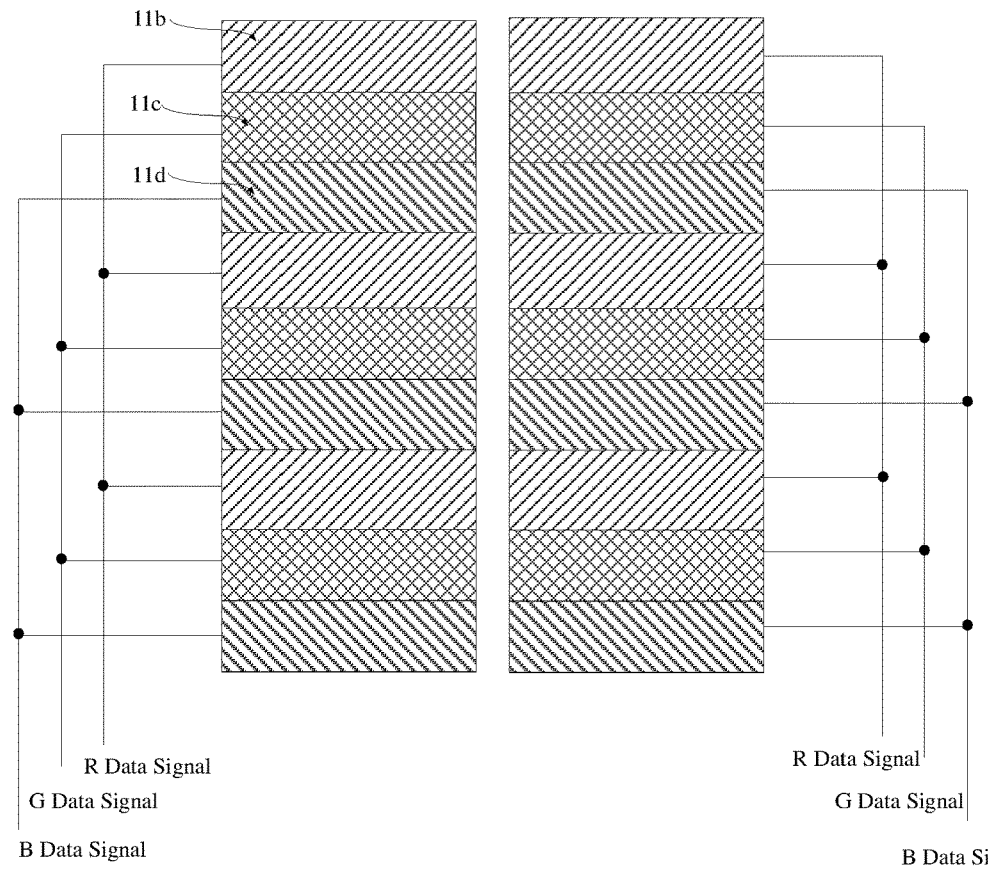
FIG. 23 is a schematic diagram of a circuit illustrating a passive matrix mode of first OLED sub-pixels in two columns of the transparent OLED substrate.

FIG. 23 is a schematic diagram of a circuit illustrating a passive matrix mode of first OLED sub-pixels in two columns of the transparent OLED substrate. Referring to FIG. 23, first OLED sub-pixels of the same color in the OLED pixel units in the first column are corresponding to one data signal; and first OLED sub-pixels of the same color in the OLED pixel units in the second column are corresponding to another one data signal, so that the first OLED sub-pixels of the same color in the first column may emit light of the same luminance at the same time, and the first OLED sub-pixels of the same color in the second column may emit light of the same luminance at the same time. In other embodiment, each first OLED sub-pixel in the first column is corresponding to one data signal; and each first OLED sub-pixel in the second column is corresponding to one data signal, so as to independently control the brightness for the light emission of each sub-pixel.

Figure 24:
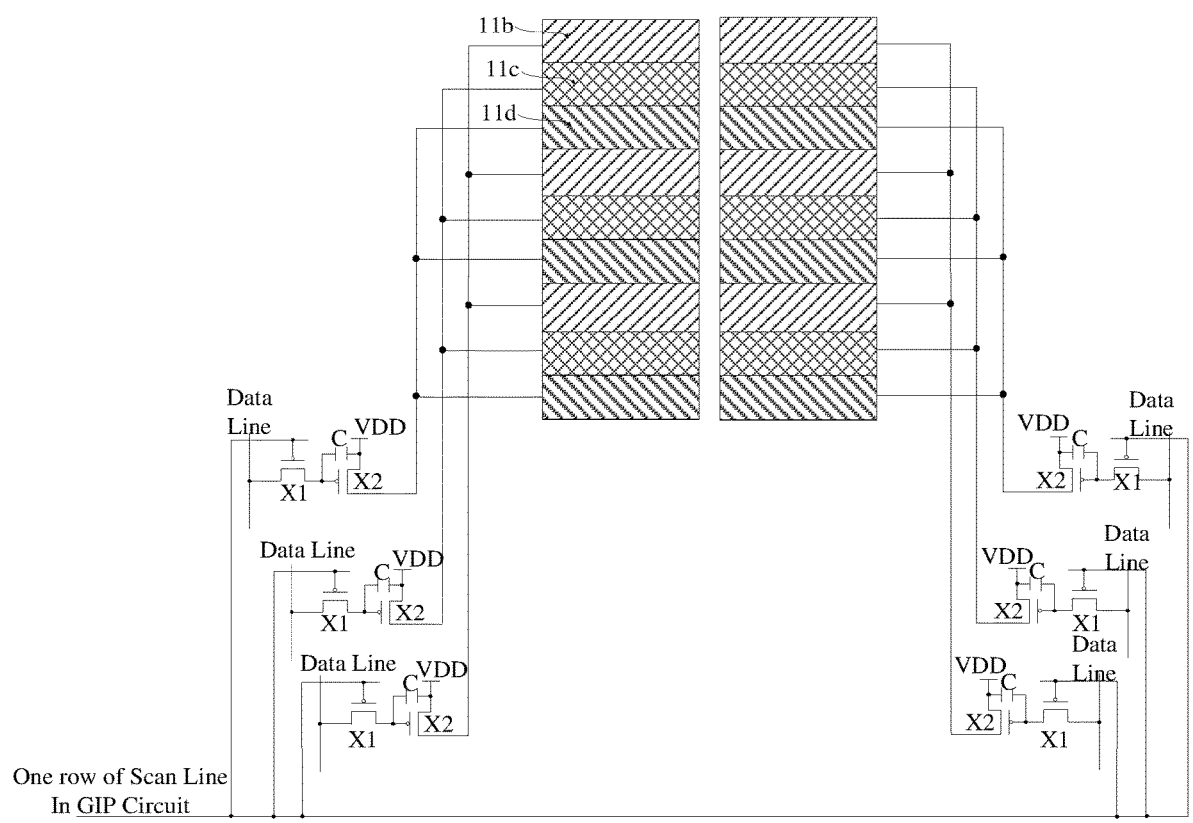
FIG. 24 is a schematic diagram of a circuit illustrating an active matrix mode of first OLED sub-pixels in two columns of the transparent OLED substrate.

FIG. 24 is a schematic diagram of a circuit illustrating an active matrix mode of first OLED sub-pixels in two columns of the transparent OLED substrate. Referring to FIG. 24, first OLED sub-pixels of the same color in the OLED pixel units in the first column are corresponding to a drain electrode of a driving transistor of one pixel driving circuit; and first OLED sub-pixels of the same color in the OLED pixel units in the second column are corresponding to a drain electrode of a driving transistor of another one pixel driving circuit, so as to collectively control sub-pixels of the same color in the first column, and collectively control sub-pixels of the same color in the second column. In other embodiments, each first OLED sub-pixel in the first column is corresponding to a drain electrode of a driving transistor of one pixel driving circuit; and each first OLED sub-pixel in the second column is corresponding to a drain electrode of a driving transistor of one pixel driving circuit, so as to independently control the light emission of each sub-pixel.

Alternatively, in addition to the 2T1C structure, the pixel driving circuit in FIG. 24 may also include a 3T1C structure, a 6T1C structure, a 7T1C structure and so on.

In a specific implementation, the transparent OLED substrates 11, 12, 13, 14 and 15 may have a shape of a water-drop, a rectangle, a notch, a circle, a semicircle, or the like.

An encapsulation layer may be provided above the transparent OLED substrates 11, 12, 13, 14 and 15 to form a display panel.

In addition to functioning as a display device, the display panel may also be provided with a touch layer to be used as a touch panel. The display panel as a semi-finished product may also be integrated and assembled with other components to form the display device such as a mobile phone, a tablet computer, a vehicle-mounted display screen, and the like.

In the display device, a light sensor is correspondingly provided beneath the transparent OLED substrates 11, 12, 13, 14, and 15, and the light sensor includes one or a combination of a camera, an iris recognition sensor, and a fingerprint recognition sensor.

Figure 25:
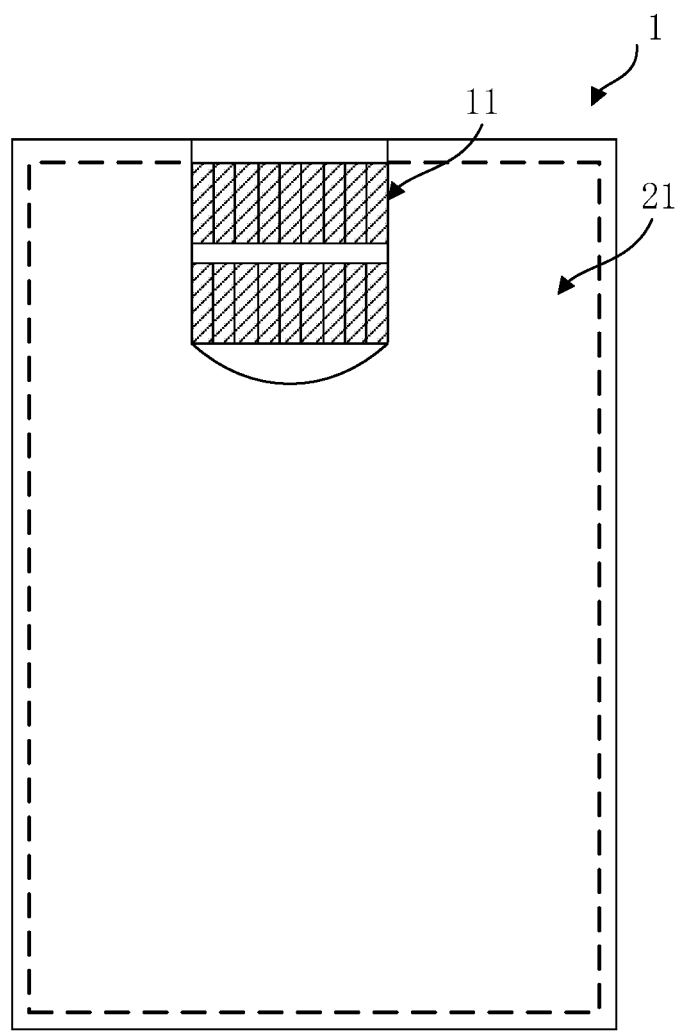
FIG. 25 is a top view of the OLED substrate in the first embodiment of the present disclosure.

FIG. 25 is a top view of the OLED substrate in the first embodiment of the present disclosure.

Referring to FIG. 25, an OLED substrate 1 includes a first OLED substrate 11 and a second OLED substrate 21.

Figure 26:
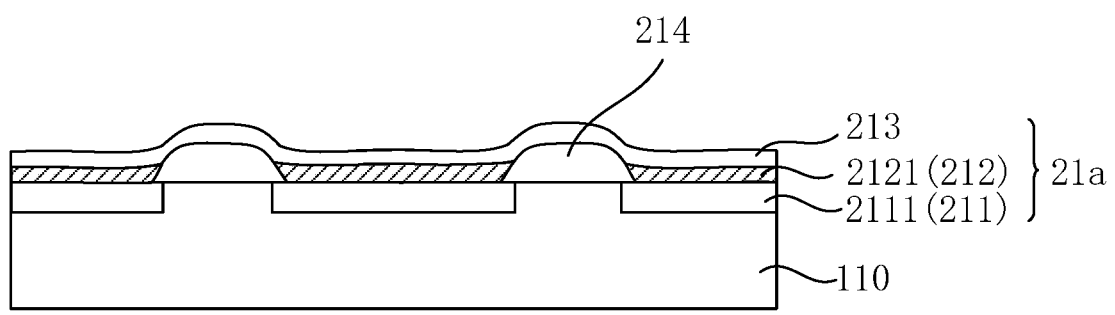
FIG. 26 is a cross-sectional view of the second OLED substrate in FIG. 25.

The first OLED substrate 11 includes the transparent OLED substrate in the above embodiment; the second OLED substrate 21 includes an opaque substrate, and the first OLED substrate 11 and the second OLED substrate 21 share a base substrate 110 (see FIG. 2, and FIG. 26).

Alternatively, the first OLED substrate 11 may further include the transparent OLED substrates 12, 13, 14, and 15 in any one of the above embodiments.

Referring to FIG. 25, the second OLED substrate 21 encloses or semi-encloses the first OLED substrate 11.

FIG. 26 is a cross-sectional view of the second OLED substrate in FIG. 25.

Referring to FIG. 26, the second OLED substrate 21 includes the base substrate 110, a third electrode layer 211 on the base substrate 110, a light emitting structure layer 212 on the third electrode layer 211, and a fourth electrode 213 on the light emitting structure layer 212.

The third electrode layer 211 has a light reflection property. The third electrode layer 211 includes a plurality of third electrodes 2111. The light emitting structure layer 212 includes a plurality of light emitting structures 2121 of different colors, and each third electrode 2111 is provided with one light emitting structure 2121. In the first direction Y and/or the second direction X, the light emitting structures 2121 of different colors are alternately arranged based on the same rule.

The fourth electrode 213 is a planar electrode.

A third electrode 2111, a light emitting structure 2121 on the third electrode 2111, and a fourth electrode 213 corresponding to the light emitting structure 2121 form a second OLED sub-pixel 21a.

In FIG. 26, size and position of the light emitting structure 2121 on the third electrode 2111 is defined by a pixel definition layer 214. Alternatively, the pixel definition layer 214 may also be omitted.

Alternatively, the first OLED substrate 11 and the second OLED substrate 21 are manufactured separately and then assembled together. Alternatively, both of the first OLED substrate 11 and the second OLED substrate 21 are fabricated simultaneously on the same base substrate 110.

In a specific manufacturing process, the third electrode layer 211 and the first electrode layer 111 may be on the same layer, and/or the fourth electrode 213 and the second electrode 113 may be on the same layer; or the light emitting structures 1121 on the first electrode layer 111 and the light emitting structures 2121 on the third electrode layer 211 are formed by evaporation in the same process.

Alternatively, the light emitting structures 1121 on the first electrode layer 111 and the light emitting structures 2121 on the third electrode layer 211, in the evaporation process, may be evaporated at one time using the same mask; may be evaporated separately using different masks, or may be evaporated using a combination of masks at one time.

In a specific implementation, the driving mode of the second OLED sub-pixels 21a is active, that is, the second OLED substrate 21 is an AMOLED.

For the OLED substrate 1, when the first OLED substrate 11 performs the display function by active matrix mode, the pixel driving circuit corresponding to the first OLED substrate 11 may be disposed in the bezel region on the second OLED substrate 21 or in a transition region between the second OLED substrate 21 and the first OLED substrate 11. Accordingly, moving the pixel driving circuit away from the display region of the first OLED substrate 11 may improve the light transmittance and reduce diffraction.

Alternatively, the second electrode 113 and the fourth electrode 213 are coupled to form an integral planar electrode. Compared with the structure in which the two planar electrodes are disconnected, on the one hand, the ground terminals and the voltage terminals may be reduced in number, and on the other hand, the structure may be simplified.

Alternatively, the second electrode 113 is a single-layer structure or a laminated structure. When the second electrode 113 is the single-layer structure, the second electrode 113 is a single-layer metal layer, or a single-layer metal mixture layer, or a single-layer transparent metal oxide layer. When the second electrode 113 is the laminated structure, the second electrode 113 is a laminated layer of a transparent metal oxide layer and a metal layer, or the second electrode 113 is a laminated layer of a transparent metal oxide layer and a metal mixture layer.

Alternatively, when the second electrode is formed of a material doped with a metal oxide, and the second electrode 113 has a thickness larger than or equal to 100 angstroms and less than or equal to 500 angstroms, the second electrode 113 has a continuous thickness as a whole, and the second electrode 113 has a light transmittance higher than 40%.

Further, when the second electrode is formed of a material doped with a metal, and the second electrode 113 has a thickness larger than or equal to 100 angstroms and less than or equal to 200 angstroms, the second electrode 113 has a continuous thickness as a whole, and the second electrode 113 has a light transmittance higher than 40%.

Further, when the second electrode is formed of a material doped with a metal, and the second electrode 113 has a thickness larger than or equal to 50 angstroms and less than or equal to 200 angstroms, the second electrode 113 has a continuous thickness as a whole, and the second electrode 113 has a light transmittance higher than 50%.

Further, when the second electrode is formed of a material doped with a metal oxide, and the second electrode 113 has a thickness larger than or equal to 50 angstroms, and less than or equal to 200 angstroms, the second electrode 113 has a continuous thickness as a whole, and the second electrode 113 has a light transmittance higher than 60%.

When the second electrode 113 is the single-layer structure, the single-layer metal layer is made of Al, Ag, or the like. The single-layer metal mixture layer is made of MgAg or a metal mixed material doped with Al, or the like. The transparent metal oxide is ITO, IZO or the like.

Alternatively, the second electrode 113 and the fourth electrode 213 are made of the same material or different materials.

Alternatively, the second electrode 113 and the fourth electrode 213 are made of the same material, the second electrode 113 and the fourth electrode 213 have the single-layer structure, and the second electrode 113 has a thickness smaller than a thickness of the fourth electrode 213.

Alternatively, the second electrode 113 and the fourth electrode 213 are made of a material of a single metal layer, a single metal mixture layer, or a single transparent metal oxide layer.

Alternatively, the second electrode 113 and the fourth electrode 213 are made of the same material, the second electrode 113 is the single-layer structure, the fourth electrode 213 is the laminated structure, and the second electrode 113 has a thickness less than a thickness of the fourth electrode 213. The fourth electrode 213 includes a second electrode material layer formed simultaneously with the second electrode 113, and a fourth electrode material layer formed above or below the second electrode material layer.

Alternatively, the fourth electrode material layer has a thickness larger than a thickness of the second electrode material layer.

Alternatively, the second electrode 113 is a single metal layer, a single metal mixture layer, a single transparent metal oxide layer, a laminated layer of a transparent metal oxide layer and a metal layer, or a laminated layer of a transparent metal oxide layer and a metal mixture layer; and the fourth electrode 213 is a single-layer metal layer, a single-layer metal mixture layer, a laminated layer of metal mixture layers, or a laminated layer of a metal layer and a metal mixture layer;

Alternatively, the second electrode 113 is made of Al, Ag, MgAg, a metal mixed material doped with Al, ITO, IZO, or the like; and the fourth electrode 213 is made of Al, Ag, MgAg, metal mixed materials doped with Al, or the like.

Although the present disclosure has been disclosed as above, the present disclosure is not limited to this. Any person skilled in the art can make various changes, combinations and modifications without departing from the spirit and scope of the present disclosure. Therefore, the protection scope of the present disclosure shall be subject to the scope defined by the claims.

What is claimed is:
1. A transparent OLED substrate, comprising:
a base substrate;
a first electrode layer located on the base substrate, the first electrode layer comprising a plurality of electrode groups arranged along a first direction, each of the electrode groups comprising at least one first electrode extending along a second direction perpendicular to the first direction;
a light emitting structure layer located on the first electrode layer,
the light emitting structure layer comprising light emitting structures of n colors, n≥1, wherein the at least one first electrode has at least one light emitting structure which corresponds to the first electrode; and a second electrode located on the light emitting structure layer, wherein, when a driving voltage is applied between the at least one first electrode and the second electrode, the transparent OLED substrate performs a display function, when no driving voltage is applied between the at least one first electrode and the second electrode, the transparent OLED substrate performs a light transmission function, wherein in the second direction, a projection of the first electrodes on the base substrate is composed of a first graphics unit or two or more first graphic units, the first graphic unit is shaped as a circular, oval, dumbbell-shaped, gourd-shaped or rectangular, such that the first graphic unit enables diffraction patterns to overlap and cancel each other out, mitigating a diffraction problem.

2. The transparent OLED substrate according to claim 1, wherein the second electrode is a planar electrode; or, the second electrode is a single-layer structure or a laminated structure, when the second electrode is the single-layer structure, the second electrode is a single-layer metal layer, a single-layer metal mixture layer, or a single-layer transparent metal oxide layer; and when the second electrode is the laminated structure, the second electrode is a laminated layer of a transparent metal oxide layer and a metal layer, or the second electrode is a laminated layer of a transparent metal oxide layer and a metal mixture layer.

3. The transparent OLED substrate according to claim 1, further comprising:

a plurality of first OLED sub-pixels, each of the first OLED sub-pixels comprising:

said first electrode;

the at least one light emitting structure located on the first electrode, the light emitting structure disposed on a same first electrode being of the same color; and a part of the second electrode corresponding to the first electrode, wherein the second electrode is coupled to the ground, and the first OLED sub-pixels are driven by an active matrix mode or a passive matrix mode.

4. The transparent OLED substrate according to claim 3, wherein when each of the first OLED sub-pixels is driven by the active matrix mode, one or more pixel driving circuits corresponding to the first OLED sub-pixels are disposed in a bezel region not overlapping with a region where the first OLED sub-pixels are located.

5. The transparent OLED substrate according to claim 3, wherein when each of the first OLED sub-pixels is driven by the passive matrix mode, a trace of the first electrode of each of the first OLED sub-pixels is disposed in a bezel region not overlapping with a region where the first OLED sub-pixels are located.

6. The transparent OLED substrate according to claim 3, further comprising:

at least one OLED pixel unit, wherein the at least one OLED pixel unit, when n=1, comprises at least one first OLED sub-pixel of the same color, and the at least one OLED pixel unit, when n≥3, comprises a plurality of first OLED sub-pixels of different colors arranged regularly.

7. The transparent OLED substrate according to claim 6, wherein the at least one OLED pixel unit is driven by the passive matrix mode; each of the first OLED sub-pixels has the first electrode, when the first direction is a column direction, the first electrodes of the first OLED sub-pixels having the same color of each OLED pixel unit in a same column are coupled to one data signal or different data signals;

when the first direction is a row direction, the first electrodes of the first OLED sub-pixels having the same color of each OLED pixel unit in a same row are coupled to one data signal or different data signals.

8. The transparent OLED substrate according to claim 6, wherein the at least one OLED pixel unit is driven by the passive matrix mode;

when the first direction is a column direction, first electrodes of the first OLED sub-pixels are coupled to drain electrodes of respective switching transistors, the switching transistors have a plurality of source electrodes coupled to one data signal or respective data signals, and gate electrodes of switching transistors corresponding to the first OLED sub-pixels of the same color in each column are coupled to a switching signal or different switching signals;

when the first direction is a row direction, first electrodes of the first OLED sub-pixels are coupled to drain electrodes of respective switching transistors, the switching transistors have source electrodes coupled to one data signal or respective data signals, and gate electrodes of switching transistors corresponding to the first OLED sub-pixels of the same color in each row are coupled to a same switching signal or different switching signals.

9. The transparent OLED substrate according to claim 6, wherein the at least one OLED pixel unit is driven by the active matrix mode;

when the first direction is a column direction, first electrodes of the first OLED sub-pixels of the same color in a same column are coupled to a drain electrode of a driving transistor in one pixel driving circuit or to drain electrodes of driving transistors in respective pixel driving circuits, and each driving transistor has a gate electrode corresponding to one data signal and a source electrode corresponding to a power supply voltage; and when the first direction is a row direction, first electrodes of the first OLED sub-pixels of the same color in a same row are coupled to a drain electrode of a driving transistor in one pixel driving circuit or to drain electrodes of driving transistors in respective pixel driving circuits, and each driving transistor has a gate electrode corresponding to one data signal and a source electrode corresponding to a power supply voltage.

10. The transparent OLED substrate according to claim 3, wherein the first OLED sub-pixels of the same color are driven by the passive matrix mode; when the first direction is a column direction, the first electrodes of ones of the first OLED sub-pixels of the same color in a same column are coupled to a same data signal; and the first electrodes of the first OLED sub-pixels of the same color in different columns are respectively coupled to the same data signal or different data signals; or when the first direction is a row direction, the first electrodes of ones of the first OLED sub-pixels of the same color in a same row are coupled to a same data signal; and the first electrodes of the first OLED sub-pixels of the same color in different rows are respectively coupled to the same data signal or different data signals.

11. The transparent OLED substrate according to claim 3, wherein the first OLED sub-pixels of the same color are driven by the active matrix mode, each of the first OLED sub-pixels has the first electrode;

when the first direction is a column direction, first electrodes of the first OLED sub-pixels of the same color in a same column are coupled to a drain electrode of a driving transistor in one pixel driving circuit; or first electrodes of the first OLED sub-pixels of the same color in columns are coupled to a drain electrode of a driving transistor in one pixel driving circuit or to drain electrodes of driving transistors in respective pixel driving circuits; and each driving transistor has a gate electrode corresponding to a data signal and a source electrode corresponding to a power supply voltage; and when the first direction is a row direction, first electrodes of the first OLED sub-pixels of the same color in a same row are coupled to a drain electrode of a driving transistor in one pixel driving circuit; or first electrodes of the first OLED sub-pixels of the same color in rows are coupled to a drain electrode of a driving transistor in a pixel driving circuit or to drain electrodes of driving transistors in respective pixel driving circuits; and each driving transistor has a gate electrode corresponding to one data signal and a source electrode corresponding to a power supply voltage.

12. The transparent OLED substrate according to claim 1, wherein each first electrode and/or the corresponding at least one of the light emitting structures have projections on the base substrate which are of the same length or different lengths, and/or the same position or different positions, the first electrode is provided with one of the light emitting structures thereon, and the light emitting structure covers across the first electrode; or the first electrode is provided with light emitting structures spaced apart, and the light emitting structures spaced apart are separated by a pixel defining layer or no pixel defining layer exists between the light emitting structures spaced apart.

13. The transparent OLED substrate according to claim 1, wherein a ratio of a size in the second direction to a size in the first direction of the first electrode is greater than 10:1.

14. A display panel comprising the transparent OLED substrate according to claim 1.

15. The transparent OLED substrate according to claim 1, wherein the first graphic unit is repeatedly provided in each first electrode of the plurality of electrode groups.

* * * * *